(12) United States Patent
Fuchs et al.

(10) Patent No.: US 11,418,124 B2
(45) Date of Patent: Aug. 16, 2022

(54) CIRCUIT FOR SWITCHING AN AC VOLTAGE

(71) Applicant: Rosenberger Hochfrequenztechnik GmbH & Co. KG, Fridolfing (DE)

(72) Inventors: Martin Fuchs, Freilassing (DE); Christoph Huber, Fridolfing (DE); Johannes Winkler, Taching am See (DE); Sven Gröger, Bochum (DE); Marcel Van Delden, Bochum (DE); Gordon Notzon, Bochum (DE); Thomas Musch, Bochum (DE)

(73) Assignee: ROSENBERGER HOCHFREQUENZTECHNIK GMBH, Fridolfing (DE)

( * ) Notice: Subject to any disclaimer, the term of this patent is extended or adjusted under 35 U.S.C. 154(b) by 50 days.

(21) Appl. No.: 17/259,423

(22) PCT Filed: May 10, 2019

(86) PCT No.: PCT/EP2019/061994
§ 371 (c)(1),
(2) Date: Jun. 17, 2021

(87) PCT Pub. No.: WO2020/011417
PCT Pub. Date: Jan. 16, 2020

(65) Prior Publication Data
US 2021/0359616 A1    Nov. 18, 2021

(30) Foreign Application Priority Data
Jul. 10, 2018 (DE) ............... 10 2018 116 597.8

(51) Int. Cl.
*H02M 5/20* (2006.01)
*H02M 5/458* (2006.01)

(52) U.S. Cl.
CPC .............. *H02M 5/20* (2013.01); *H02M 5/458* (2013.01)

(58) Field of Classification Search
CPC ................................. H02M 5/20; H02M 5/458
See application file for complete search history.

(56) References Cited

U.S. PATENT DOCUMENTS 2,817,772 A    12/1957  Lee
3,611,434 A *  10/1971  Jones ...................... H02M 5/20
                                                           318/807

(Continued)

FOREIGN PATENT DOCUMENTS

CN         1415131 A    4/2003
CN       101416405 A    4/2009
(Continued)

*Primary Examiner* — Jue Zhang
(74) *Attorney, Agent, or Firm* — David P. Dickerson

(57) ABSTRACT

The present invention relates to a circuit for switching an AC voltage. It contains an input terminal able to be connected to an AC voltage source, an output terminal able to be connected to a load impedance, and a first series circuit. This series circuit comprises a diode and a circuit for storing electrical charges. The series circuit has a first end connection that is connected to the input terminal and a second end connection that is connected to the output terminal. The circuit for switching an AC voltage furthermore contains a DC voltage source, which is connected to an electrical connection between the diode and the input terminal or to an electrical connection between the diode and the output terminal and is designed to impress a DC current in the diode. The circuit for switching an AC voltage finally contains a first switch that is connected to an electrical connection between the diode and the circuit for storing electrical charges at one terminal. The first switch is designed to switch between a switching state in which a potential dependent on a reference potential is present at the (Continued)

electrical connection between the diode and the circuit for storing electrical charges, and a switching state in which an electrical floating potential is present in the electrical connection between the diode and the circuit for storing electrical charges.

20 Claims, 11 Drawing Sheets

(56) References Cited

U.S. PATENT DOCUMENTS

| | | | | |
|---|---|---|---|---|
| 3,715,647 | A | * | 2/1973 | Biringer .................. H02M 5/20 327/583 |
| 4,211,940 | A | * | 7/1980 | Minami .................. H02M 5/20 327/217 |
| 4,376,911 | A | * | 3/1983 | Kaneda .................. H02M 5/20 315/176 |
| 4,979,232 | A | | 12/1990 | Martz et al. |
| 5,118,993 | A | * | 6/1992 | Yang ........................ H02M 5/20 338/219 |
| 5,654,679 | A | | 8/1997 | Mavretic |
| 5,978,049 | A | | 11/1999 | Ruitenburg |
| 2008/0310382 | A1 | | 12/2008 | Nakagawa et al. |
| 2015/0326136 | A1 | * | 11/2015 | Strzalkowski ........ H02M 5/293 323/355 |

FOREIGN PATENT DOCUMENTS

| | | |
|---|---|---|
| CN | 104662286 A | 5/2015 |
| DE | 198 52 652 A1 | 5/2000 |
| EP | 0 455 130 A1 | 11/1991 |
| EP | 2 881 579 A1 | 6/2015 |
| KR | 20060090330 A | 11/2006 |
| KR | 101594517 B1 | 2/2016 |
| WO | 01 /35530 A2 | 5/2001 |
| WO | 0150568 A1 | 7/2001 |
| WO | 2014/050182 A1 | 4/2014 |

* cited by examiner

CIRCUIT FOR SWITCHING AN AC VOLTAGE

FIELD OF THE INVENTION

The present invention relates to a circuit for switching an AC voltage.

TECHNICAL BACKGROUND

In order to switch a high-frequency voltage, use is preferably made of a PIN diode, as illustrated for example in KR 101594517 B1. Such a PIN diode has what is called an intrinsic region between a P-doped region and an N-doped region. In the case of a forward-biased PIN diode, a multiple concentration of charge carriers from the P-doped and N-doped regions, in comparison with the charge carrier concentration already intrinsically present in the intrinsic region, is injected into this intrinsic region. This high charge carrier injection from the P-doped and N-doped regions shifts the electric field from the P-doped and N-doped region deep into the intrinsic region. This accelerates the charge carrier transport within the PIN diode and thus makes it suitable for high-frequency applications. In particular at higher frequencies starting from 10 MHz, the PIN diode loses its rectifying effect in comparison with a normal p-n diode. The recombination time of a PIN diode, that is to say the time required to completely remove the high concentration of injected charge carriers from the intrinsic region, is significantly higher than that of a normal p-n diode.

Figure 2A:
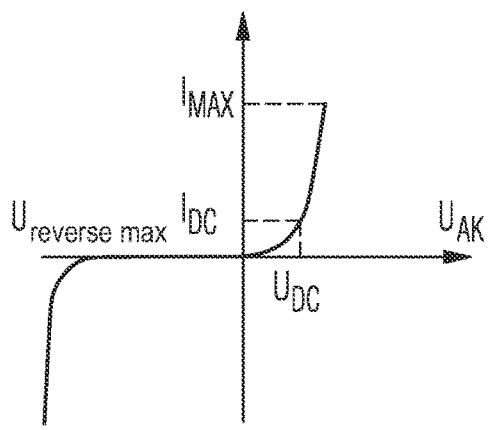
Figure 2B:
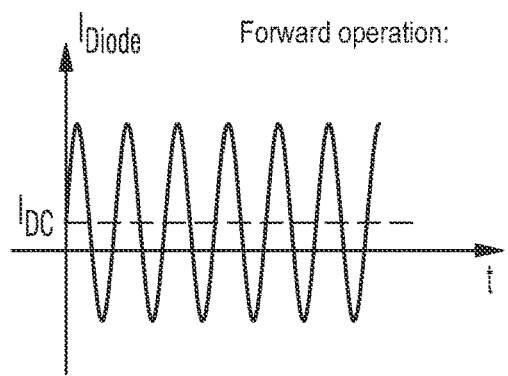

A PIN diode, which is biased with a DC voltage UDC in forward operation in accordance with its characteristic curve according to FIG. 2A and thus channels a diode DC current IDC necessary for forward operation, is thus self-conducting when a higher-frequency AC voltage is present according to FIG. 2B. The charge carriers in the intrinsic region are no longer able to follow the rapid change of direction of the higher-frequency AC voltage. The PIN diode actually behaves like a resistor controlled by the DC voltage UDC.

However, this self-conducting characteristic of the PIN diode when a higher-frequency AC voltage is present has the disadvantage that the PIN diode is not able to block itself at its own volition. As may be seen in FIG. 1, the operation of a PIN diode requires not only a DC voltage network for forward-biasing the PIN diode, but also, disadvantageously, a DC voltage network for reverse-biasing the PIN diode.

The associated higher cost of an additional DC voltage source and of additional coils, which prevent the high-frequency signal from being fed into the DC voltage network, represents a significant application obstacle in cost-sensitive fields of application, such as for example in the automotive sector.

WO 01/35530 A2 discloses a circuit in which the state of a high-frequency transmission path is controlled between blocking and conducting via a series circuit consisting of a capacitor and a PIN diode. The series circuit consisting of the capacitor and the PIN diode is connected between the high-frequency transmission path and a ground potential. Due to its self-rectification, the PIN diode biases itself to the high-frequency peak voltage, such that an externally supplied negative bias voltage is no longer necessary.

Due to the series circuit consisting of capacitor and PIN diode between the high-frequency transmission path and the ground potential, when the PIN diode is blocked for the high-frequency signal, there is a stub line from the high-frequency transmission path via the capacitor to the blocked PIN diode. A high-frequency signal coupled into the stub line from the high-frequency transmission path is reflected at the blocked PIN diode and is superimposed, with a phase offset, on the high-frequency signal transmitted directly via the high-frequency transmission path. Wiring the PIN diode in this way significantly worsens the high-frequency transmission behavior of the high-frequency transmission path.

In the blocked state of the high-frequency transmission path, that is to say when the PIN diode is conductive, a high current flows through the series circuit to the ground potential. In order to achieve this high current-carrying capacity, considerable effort has to be made when designing the high-frequency amplifier, the capacitor and the PIN diode.

In addition, such wiring of a PIN diode also requires the capacitor of the series circuit in addition to the coupling-out capacitor, such that this does not result in a solution with a minimum number of components.

Finally, for a distribution circuit in which the inputs of a plurality of parallel-connected high-frequency transmission paths are connected to a common input terminal, all parallel-connected high-frequency transmission paths are blocked when the PIN diode is wired in this way in the case of at least one conductive PIN diode. If a plurality of PIN diodes are blocked at the same time due to a drive error, then a plurality of high-frequency transmission paths may be conductive at the same time. Such wiring of a PIN diode is therefore unsuitable for a distribution circuit in which a single high-frequency transmission path is always conductive and all of the other high-frequency transmission paths are blocked.

This is a condition that needs to be improved.

SUMMARY OF THE INVENTION

Against this background, the present invention is based on the object of specifying a circuit of minimized complexity for a diode, by way of which it is possible to switch an AC voltage.

Inter alfa, the present disclosure teaches a circuit for switching an AC voltage comprising
an input terminal able to be connected to an AC voltage source,
an output terminal able to be connected to a load impedance,
a first series circuit comprising a diode and a circuit for storing electrical charges,
wherein the first series circuit has a first end connection that is connected to the input terminal and a second end connection that is connected to the output terminal,
a DC voltage source that is connected to an electrical connection between the diode and the input terminal or to an electrical connection between the diode and the output terminal, and
is designed to impress a DC current in the diode,
and a first switch that is connected to an electrical connection between the diode and the circuit for storing electrical charges at one terminal and
that is designed to switch between a switching state in which a potential dependent on a reference potential is present at the electrical connection between the diode and the circuit for storing electrical charges, and a switching state in which an electrical floating potential is present in the electrical connection between the diode and the circuit for storing electrical charges.

The present disclosure recognizes that that, by virtue of opening the first switch, there is an electrical floating potential in the electrical connection between the diode and the circuit for storing electrical charges.

An electrical floating potential in a circuit node of an electrical circuit or in an electrical connection between two circuit elements of a circuit is present when the circuit node or the electrical connection for a DC current does not have a conductive electrical connection to a reference potential of the circuit. The circuit node or the electrical connection is thus isolated from each reference potential of the circuit, and thus independent of a reference potential.

Neither the circuit for storing electrical charges nor the opened first switch allows a flow of current for a DC current, and thus does not constitute a conductive electrical connection to a reference potential of the circuit for a DC current. In order for there to be an electrical floating potential in the electrical connection between the diode and the circuit for storing electrical charges, the diode must enter the reverse state when the first switch is open, without there being an additional electrical connection to a reference potential of the circuit for this purpose.

This is possible because the DC current component IDC impressed into the diode by the DC voltage source and the AC current component IHF impressed into the diode by the AC voltage source do not drop abruptly when the first switch is opened, but rather drop to zero in a transient process with a time constant. This time constant results primarily from the flow resistance of the diode and the capacity of the circuit for storing electrical charges. During this delayed drop in the diode current, the circuit for storing electrical charges, which is connected to the diode, is charged with the electrical charges of the diode current to a specific voltage which, starting from a specific value, serves as reverse voltage for the diode.

In the event that a low-frequency AC voltage is applied to the diode, a rectifying effect occurs in the diode. The diode is conductive only when a positive anode-cathode voltage is present. As may be seen in FIG. 2C for this case, the diode current contains only positive current components which consist of the DC current component IDC and the superimposed AC current component IHF. Both the DC current component IDC and the superimposed AC current component IHF each approach zero with the time constant. Over this period, the circuit for storing electrical charges is charged with the positive diode current. The circuit for storing electrical charges is not discharged over this period due to the lack of a negative diode current.

In the case of a higher-frequency AC voltage, that is to say an AC voltage with a frequency between 0.3 MHz and 30 GHz, the diode is designed as a PIN diode. In this case, there is no rectifying effect at the PIN diode. As may be seen in FIG. 2D, a diode current flows through the PIN diode without interruption over the whole period in which both the DC current component IDC and the superimposed AC current component IHF each drop toward zero with the time constant. In this period, the circuit for storing electrical charges is thus both charged and discharged. Due to a positive DC current component IDC, however, the free charge carriers of the diode current that are supplied to the circuit for storing electrical charges are in total greater than the charge carriers drawn from the circuit for storing electrical charges (see in this regard also the area corresponding to the charge under the overall diode current in FIG. 2D). Thus, in this case too, the circuit for storing electrical charges is charged to a sufficient voltage, which constitutes a sufficient reverse voltage for blocking the diode.

Thus, in both cases, self-blocking of the diode or the PIN diode is advantageously achieved without applying a DC voltage in the reverse direction to the diode or the PIN diode from a reference potential source.

Inter alfa, the present disclosure teaches that a first end connection of the first series circuit is connected to the input terminal, and a second end connection of the first series circuit is connected to the output terminal. The first series circuit is thus integrated into the high-frequency transmission path. In a distribution circuit containing a plurality of parallel-connected high-frequency transmission paths, only a single high-frequency transmission path, and thus a single PIN diode, is ever conductive, while all of the other high-frequency transmission paths or PIN diodes are blocked. In a distribution circuit containing a first series circuit integrated into the high-frequency transmission path, a current thus flows only in one PIN diode at any operating time, while, in a distribution circuit with a circuit implementation according to WO 01/35530 A2, one current flows in a plurality of diodes in each case. The circuit implementation in accordance with the present disclosure is thus advantageously minimized in terms of energy consumption in comparison with the prior art.

A DC current is impressed in the diode by the DC voltage source, as is conventional, by a resistor connected between the DC voltage source and the diode. As an alternative, a DC current may also be impressed by a DC current source. Finally, a parallel implementation of a DC voltage source and a DC current source is also possible.

In order to impress the DC current into the diode, the DC voltage source is connected to an electrical connection between the input terminal and the diode or to an electrical connection between the output terminal and the diode.

An electrical connection should in this case be understood to mean a direct electrical connection between the diode and the input terminal or the output terminal, for example by way of a conductor track or strip line implemented on a printed circuit board or a substrate or by way of a (bonding) wire. In addition, an electrical connection should also be understood to mean an electrically conductive connection between the diode and the input terminal or the output terminal that is suitable for the transmission in particular of an AC voltage or a high-frequency voltage, in which additional electronic components, for example capacitors or resistors, are interposed. The same definition of an electrical connection also applies to the electrical connection between the diode and the circuit for storing electrical charges.

The connection of the DC voltage source to the electrical connection between the input terminal and the diode or to the electrical connection between the output terminal and the diode may ideally be made in this case directly without the interposition of additional components or circuits. Ideally, the connection of the DC voltage source to the electrical connection, as will be shown in the individual embodiments and variants of the circuit, also includes the interposition of further components or circuits. This definition of a connection of an electronic component to an electrical connection applies analogously to all other equivalent wording also used in the patent application.

The first switch, which is connected at one terminal to an electrical connection between the diode and the circuit for storing electrical charges, is preferably able to be switched between two switching states. In a first switching state of the first switch, there is an (electrical) potential dependent on a reference potential in the electrical connection between the diode and the circuit for storing electrical charges. The potential may in this case correspond to the reference potential or be dependent on the reference potential via a factor. The reference potential as well as the factor are each preferably fixed variables. Depending on the specific application of the circuit, the reference potential and/or the factor may also vary over time or be dependent on other parameters, for example the ambient temperature of the circuit, and therefore be variable. Depending on specific application requirements, the first switch may also have more than two switching states.

The first switch is implemented in each case as an electronic switch, preferably as a switching transistor. Such a switching transistor is implemented either using bipolar technology or as a field-effect transistor. In addition, such an electronic switch may be implemented as a diode, semiconductor relay or thyristor. The characteristics mentioned for the first switch apply in an equivalent manner to the switches still to be described below.

The ground potential of the circuit is preferably used as reference potential. As an alternative, a reference potential different from the ground potential may be chosen. The value of the reference potential should be chosen in this case depending on the DC voltage level generated by the DC voltage source and the parameters of the electronic components used in the DC current forward path, such that a sufficient diode DC current $I_{DCforward}$ is able to flow through the diode.

The input terminal of the circuit, which serves as AC voltage input terminal, preferably as high-frequency input terminal, is able to be connected to an AC voltage source or high-frequency voltage source. This may be for example a frequency oscillator or an electronic circuit, at whose output an AC voltage or high-frequency voltage is present. In addition to an AC voltage source, an AC current source or a circuit that generates an AC current at its output is also alternatively possible.

The output terminal of the circuit is able to be connected to a load impedance. In the automotive sector, the circuit may be used to connect a high-frequency AC voltage through to a circuit in which the high-frequency AC voltage is superimposed on a high-voltage pulse. The high-voltage pulse superimposed with a high-frequency voltage is used to drive a spark plug. In this application case, the load impedance results at least from a line impedance of a high-frequency line located between the circuit and the electrical spark plug, the impedance of the inner conductor located in the electrical spark plug, additional stray capacitances and the impedance prevailing in the combustion chamber between the two spark plug electrodes.

Advantageous refinements and developments become apparent from the further dependent claims and from the description with reference to the figures of the drawing.

It is self-evident that the features mentioned above and the features yet to be discussed below may be used not only in the respectively specified combination but also in other combinations or individually without departing from the scope of the present invention.

In one preferred refinement of the circuit of the present disclosure, the first switch is designed as a first on switch or as a first off switch.

In the case of an on switch, a closed electrical contact connection between the two terminals of the switch is achieved in a first switching state, that is to say when driving of the on switch is activated, and the switch is thus closed. In the case of an on switch, an open electrical contact connection between the two terminals of the switch is achieved in a second switching state, that is to say when driving of the on switch is not activated, and the switch is thus opened. In the case of an off switch, the switching states are inverted with respect to the switching states of the on switch. In the case of the off switch, an open electrical contact connection between the two terminals of the switch is achieved in a first switching state, that is to say when driving of the off switch is activated, and the switch is thus opened. A closed electrical contact connection between the two terminals of the switch is achieved in a second switching state, that is to say when driving of the off switch is not activated, and the switch is thus closed.

If one terminal of the first switch, which is implemented as an on switch or an off switch, is connected to a reference potential, while the other terminal of the first switch is connected to the electrical connection between the diode and the circuit for storing electrical charges, then the electrical connection between the diode and the circuit for storing electrical charges is electrically connected to a reference potential in one switching state and electrically isolated from the reference potential in the other switching state. In one switching state, there is thus a reference potential or an electrical potential dependent on a reference potential in the electrical connection between the diode and the circuit for storing electrical charges. In the other switching state, there is an electrical floating potential in the electrical connection between the diode and the circuit for storing electrical charges after the end of the transient process in which the diode was blocked after the first switch was opened.

In addition to an on switch or an off switch, the first switch may also be implemented as a changeover switch. In this case, the terminal that is connected to the electrical connection between the diode and the circuit for storing electrical charges is either connected to a first further terminal that is connected to a reference potential or connected to a second further terminal that is not connected to any potential, in particular to any reference potential. The second further terminal of the changeover switch is "switched open" in this case.

In a further preferred embodiment of the circuit of the present disclosure, a circuit with a low-pass filter characteristic or a circuit with a resistor is connected between the DC voltage source that impresses a DC current in the diode and the electrical connection between the diode and the input terminal or the electrical connection between the diode and the output terminal. Likewise, a circuit with a low-pass filter characteristic or a circuit with a resistor is connected between the first switch and the electrical connection between the diode and the circuit for storing electrical charges.

The circuit with a low-pass filter characteristic is a circuit whose transmission characteristic corresponds to that of a low-pass filter. This circuit thus allows through signals or signal components with a frequency below the cutoff frequency of the low-pass filter and blocks or at least attenuates signals or signal components with a frequency above the cutoff frequency of the low-pass filter. A coil is preferably used as circuit with a low-pass filter characteristic. The coil is preferably in each case a cylindrical coil without an integrated ferrite core, that is to say an air-cored coil. In addition, a cylindrical coil with an integrated ferrite core or a coil with differently shaped and wound turns may also be used.

The coil that is connected between the first switch and the electrical connection between the diode and the circuit for storing electrical charges is referred to below as first coil. The coil that is connected between the DC voltage source and the electrical connection between the input terminal and the diode or between the DC voltage source and the electrical connection between the output terminal and the diode is referred to below as second coil.

The circuit with a resistor may be for example a bonding wire that exhibits inductive behavior in a high frequency range. As an alternative, the circuit with a resistor may also be a strip line that is designed as what is called a butterfly stub and thus likewise exhibits inductive behavior in a higher frequency range.

Both the circuit with a low-pass filter characteristic and the circuit with a resistor prevent the AC voltage fed in at the input terminal from flowing out, on the one hand, in the direction of the DC voltage source and, on the other hand, in the direction of the first switch and thus in the direction of the reference potential. The AC voltage fed in at the input terminal thus flows only through the diode or the PIN diode to the output terminal. Short-circuiting of the fed-in AC voltage to the DC voltage source or to the reference potential is prevented.

The circuit for storing electrical charges is preferably a capacitor that is able to store electrical charges. As an alternative, the circuit for storing electrical charges may also contain an array of capacitors. In addition to a capacitor, a capacitive diode or the gate of a MOS field-effect transistor may alternatively also be used as circuit for storing electrical charges.

In a first development of the circuit of the present disclosure, a series circuit consisting of a third coil and an interconnection of a plurality of further capacitors is provided between the reference potential and the electrical connection between the diode and the circuit for storing electrical charges.

When the first switch is opened, that is to say in the transition between forward and reverse operation of the diode, the other capacitors are put into a parallel configuration. To this end, respective second switches are connected on the diode side, that is to say in the electrical connection to the diode, between the further capacitors, and respective third switches are connected on the reference potential side, that is to say in the electrical connection to the reference potential, and are each closed. At the same time, respective fourth switches are connected between the further capacitors, and are each open.

The capacitor and the parallel-connected further capacitors are each charged to the same capacitor voltage with the charge flow through the diode. As soon as this capacitor voltage has reached a respective certain voltage level at the capacitor and all of the parallel-connected further capacitors, the parallel configuration of the further capacitors is put into a series configuration. To this end, the second and third switches are each opened and the fourth switches are closed at the same time.

As a result of the series configuration of the further capacitors, an overall capacitor voltage is present across all of the series-connected further capacitors and corresponds to a multiple of an individual capacitor voltage, which corresponds to the number of series-connected further capacitors. This results in a balancing process between the higher total capacitor voltage of the series-connected further capacitors and the lower individual capacitor voltage of the capacitor. Following the balancing process, a reverse voltage is established at the diode, which is between the overall capacitor voltage of the series-connected further capacitors and the individual capacitor voltage of the capacitor. The reverse voltage able to be achieved in the first development of the circuit of the present disclosure is thus increased in comparison with the reverse voltage able to be achieved in the basic circuit in accordance with the present disclosure.

The third coil in the first development of the circuit of the present disclosure prevents short-circuiting of the AC voltage present at the diode through the interconnection of the further first capacitors to the reference or ground potential.

In a preferred second development of the circuit of the present disclosure for switching an AC voltage, when the first switch is opened, a plurality of further capacitors are connected in parallel with the capacitor in the transition of the diode from forward to reverse operation. The parallel connection of the further capacitors to the capacitor is made using second switches, which are each connected between two capacitors on the diode side, that is to say in the electrical connection to the diode, and using third switches, which are each connected between two capacitors on the input terminal or output terminal side, that is to say in the electrical connection to the input terminal or to the output terminal.

In the second development of the circuit of the present disclosure, the capacitor and the further capacitors are charged in parallel in the transient phase between the forward and reverse operation of the diode. In this case, the capacitor and all of the further capacitors are each charged to the same capacitor voltage. If the capacitor and the further capacitors preferably have the same capacitance, then the same amount of charge is in each case on the capacitor and on all of the further parallel-connected capacitors.

If the capacitor and the further capacitors are each connected in series when a certain capacitor voltage level is reached, then the individual capacitor voltages are summed. By virtue of switching the capacitors from a parallel to a series configuration, a higher reverse voltage, corresponding to the number of capacitors used, is thereby present at the diode. It is thereby advantageously possible to achieve a reverse voltage that is higher than the reverse voltage able to be achieved in each case in the basic embodiment and the first development of the circuit of the present disclosure, and thus enables reliable blocking of the diode.

In the parallel configuration of the capacitor and the further capacitors, the second and third switches are each closed, while the fourth switches are each open. In the series configuration of the capacitor and the further capacitors, the second and third switches are each open and the fourth switches are closed at the same time.

In a third development of the circuit of the present disclosure, a fifth switch is connected between the diode and the series circuit consisting of the first coil and the first switch.

The fifth switch is also opened synchronously with the first switch. Opening the first and fifth switches results in an abrupt current interruption in the first coil, which induces a voltage in the first coil. This voltage induced in the first coil has a voltage drop that is directed in the direction of the diode.

A sixth switch connects an electrical connection, which connects the fifth switch to the first coil, to a ground potential of the circuit. In order to relate the voltage induced in the first coil to a reference potential, the sixth switch is closed synchronously or at least close in time to the opening of the first and fifth switches, and the diode-side terminal of the first coil is thus brought to ground potential.

A seventh switch, which is connected between the diode and the electrical connection between the first coil and the first switch, is closed synchronously or at least close in time to the closing of the sixth switch. In the preferred case of simultaneous opening of the first and fifth switches and simultaneous closing of the sixth and seventh switches, the maximum possible DC current $I_{DCforward}$ flows through the diode at this time. The voltage induced in the first coil is therefore maximized as a result of the maximum possible current change. By closing the seventh switch, the capacitor is charged as quickly as possible with the voltage induced in the first coil. A reverse voltage is thus present at the diode as quickly as possible, which reverse voltage is still significantly higher than the reverse voltage able to be achieved in each case in the basic embodiment in accordance with the present disclosure and the first and second developments of the circuit of the present disclosure.

Short-circuiting of the voltage induced in the first coil across the fifth and seventh switches is prevented by the "additional" fifth switch, which is open during the charging time of the capacitor. In order also to prevent the capacitor from discharging following the charging process via the closed sixth and seventh switches and the first coil to the ground potential, the seventh switch is opened again after the very short charging phase of the capacitor. By suitably dimensioning the inductance of the first coil, it is additionally possible to set the value of the voltage induced in the first coil.

Finally, it should be mentioned at this juncture that, by interposing a suitably dimensioned resistor between the first switch and the electrical connection between the diode and the circuit for storing electrical charges, it is possible to increase the electrical potential in the electrical connection between the diode and the circuit for storing electrical charges already in forward operation of the diode. It is thereby advantageously possible to achieve a higher reverse voltage or faster blocking of the diode in the transition between forward and reverse operation of the diode in the basic circuit in accordance with the present disclosure as well as in all of the developments of the basic circuit in accordance with the present disclosure.

In a fourth development of the circuit of the present disclosure for switching an AC voltage, further first series circuits each comprising a further diode and a further circuit for storing electrical charges are provided. Each further series circuit in each case has a first end connection and a second end connection. The first end connection of each further series circuit is in each case connected to the input terminal. The second end connection of each further series circuit is in each case connected to a further output terminal, which may in each case be connected to a further load impedance. The AC voltage fed in at the input terminal is thereby able to be switched to one or more of the output terminals.

In order to switch each individual further diode in each case separately in the forward or reverse direction, a further first switch is connected in each case to the electrical connection between the respective further diode and the respective further circuit for storing electrical charges at one terminal for each further diode. The respective further first switch is designed to switch between a switching state in which a potential dependent on the reference potential is present in the electrical connection between the respective further diode and the respective further circuit for storing electrical charges, and a switching state in which an electrical floating potential is present in the electrical connection between the respective further diode and the respective further circuit for storing electrical charges.

If the respective further first switch switches a potential dependent on the reference potential into the electrical connection between the respective further diode and the respective further circuit for storing electrical charges, then the AC voltage fed in at the input terminal flows via the respective further diode to the respective further output terminal. If on the other hand a further switching state of the respective further first switch causes an electrical floating potential in the electrical connection between the respective further diode and the respective further circuit for storing electrical charges, the respective further diode is blocked.

With regard to the components of this fourth development of the circuit in accordance with the present disclosure, what was stated above with regard to the equivalent components of the basic circuit in accordance with the present disclosure applies in an equivalent manner.

The first switch belonging to each diode is driven via a control circuit. The control circuit may be designed as a microprocessor or comprise a microprocessor. Instead of a microprocessor, provision may also be made for any other circuit for implementing the drive function, for example one or more arrangements of discrete electrical components on a printed circuit board, a programmable logic controller (PLC), an application-specific integrated circuit (ASIC) or another programmable circuit, for example including a field-programmable gate array (FPGA), a programmable logic arrangement (PLA) and/or a commercially available computer.

The control circuit, which is connected to each first switch via a respective signal transmission path, switches each of the first switches on or off in each case. Each first switch is preferably in each case switched on at a different time, such that the AC voltage fed in at the input terminal is only forwarded to a single output terminal. However, it is also conceivable for the AC voltage fed in at the input terminal to be able to be switched to a plurality of output terminals via a plurality of switched-on first switches.

Each first switch is preferably switched on by the control circuit only when each of the first switches is switched off. This achieves a situation whereby the transient transition from a conductive diode, preferably a conductive PIN diode, to a blocked diode, preferably a blocked PIN diode, is completed and reverse operation of each diode is thus guaranteed.

When each first switch is switched off, the control circuit takes into account the fact that the switch-off time of each first switch lasts in each case at least until a voltage potential in the electrical connection between the respective diode and the respective circuit for storing electrical charges is in each case greater than a voltage that is the highest voltage of all of the voltages in each case generated by the DC voltage sources contained in the circuit. This ensures that the diode or PIN diode to be switched off in each case is reliably in reverse operation at this time.

The present disclosure furthermore discloses a controlled AC voltage source. This controlled AC voltage source comprises an AC voltage source, preferably a high-frequency voltage source, and a circuit for switching an AC voltage, whose input terminal is connected to the AC voltage source. A control circuit belonging to the circuit for switching an AC voltage is designed in this case such that it switches the AC voltage source on and off. In the case of a controlled AC voltage source, the control circuit therefore not only takes responsibility for the switching through or blocking of the AC voltage by the respective diode, but also the switching on and off of the AC voltage source, independently of the switching through or blocking.

In one preferred development of the controlled AC voltage source in accordance with the present disclosure, the control circuit is designed such that it leaves the AC voltage source switched on until the voltage potential in the electrical connection between the respective diode and the respective circuit for storing electrical charges is in each case greater than a highest voltage of all of the DC voltage sources contained in the circuit.

This advantageously ensures that, after the respective first switch is opened, the associated circuit for storing electrical charges is charged not only with the electrical charges of the decaying diode DC current, but also with the electrical charges of the decaying diode AC current. The circuit for storing electrical charges is thus charged to a higher reverse voltage. Either earlier blocking of the respective diode or reliable blocking of the respective diode is thereby achieved.

The present disclosure furthermore comprises a motor-driving circuit that cyclically supplies an AC voltage from an AC voltage source to a specific number of electrical spark plugs. To this end, the AC voltage source is connected to the input terminal of the circuit of the present disclosure for switching an AC voltage, and each electrical spark plug is connected in each case to an output terminal of the circuit of the present disclosure for switching an AC voltage.

The motor-driving circuit in accordance with the present disclosure creates a circuit that is able to switch on an AC voltage generated by a single AC voltage source in the cyclical alternation of a number of electrical spark plugs. The motor-driving circuit thus advantageously makes it possible to achieve a significant saving in terms of AC voltage sources.

The above refinements and developments may be combined with one another as desired, provided that this makes sense. Further possible refinements, developments and implementations of the invention also encompass combinations—not explicitly mentioned—of features described above or below with regard to the exemplary embodiments. A person skilled in the art in particular will also in this case add individual aspects to the respective basic form of the present invention as improvements or additions.

INDICATION OF CONTENTS OF THE DRAWING

Figure 1:
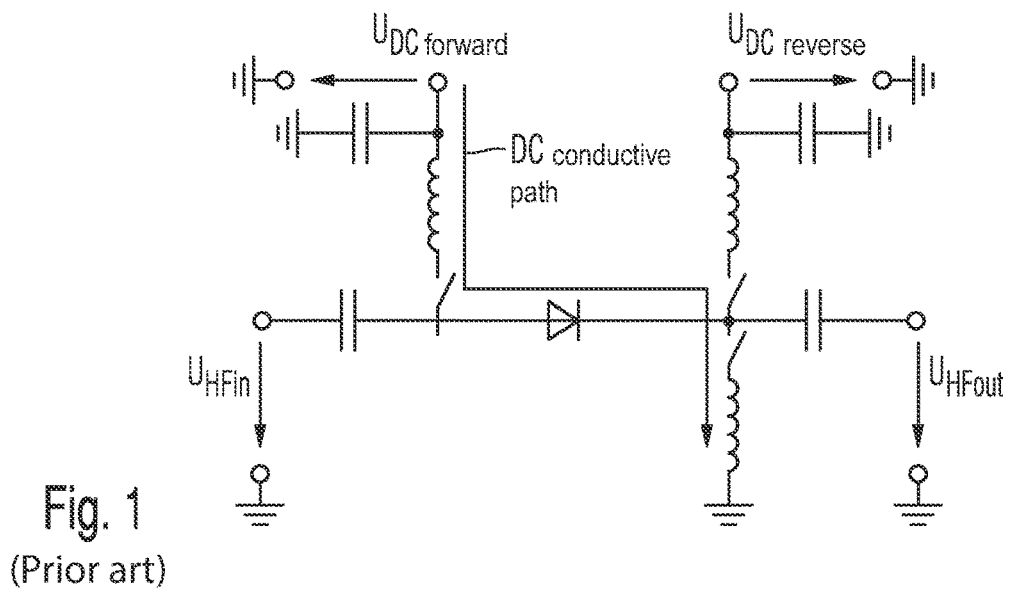
Figure 2C:
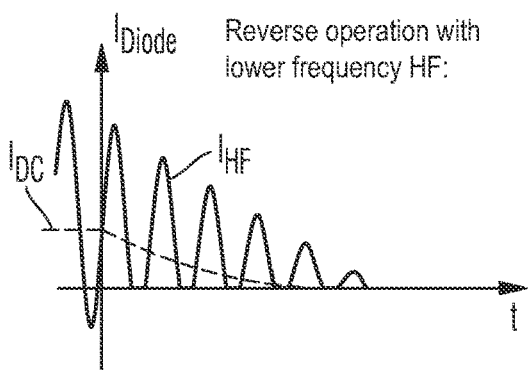
Figure 2D:
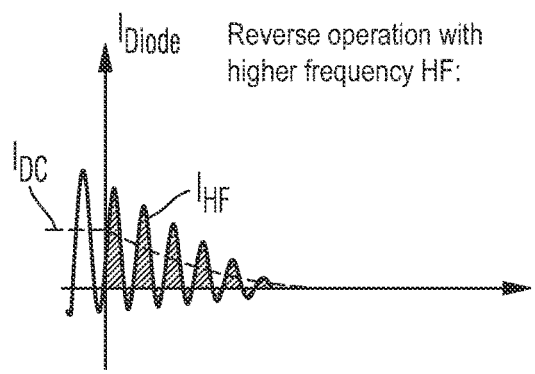
Figure 3A:
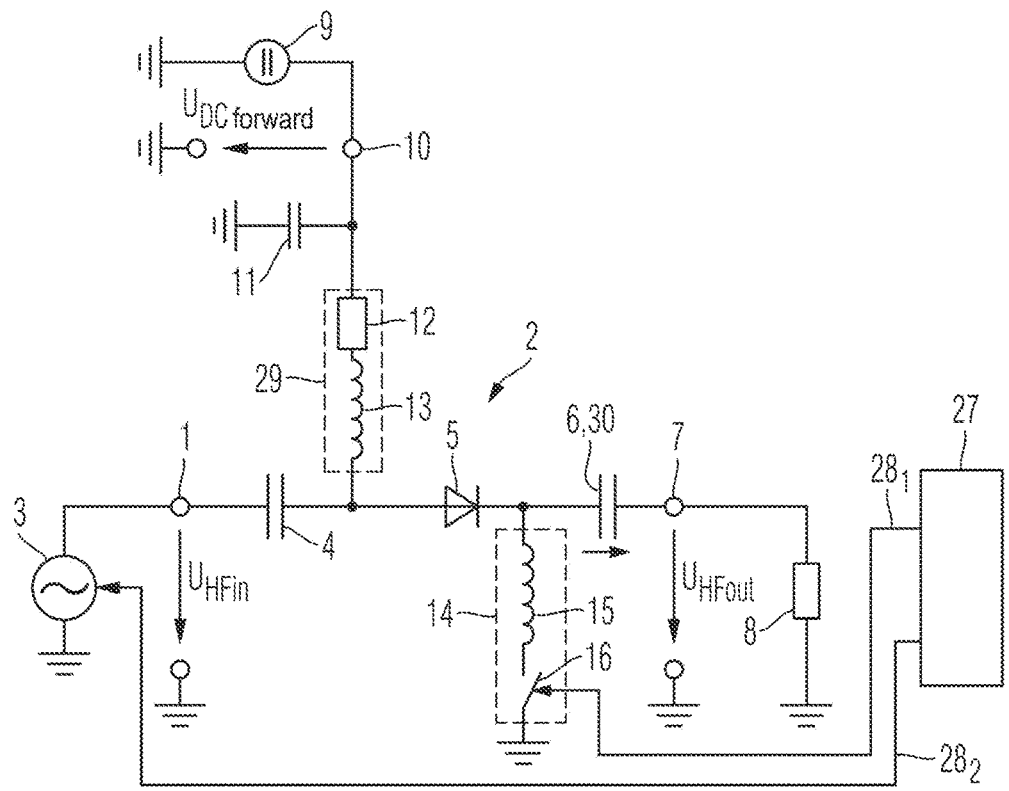
Figure 3B:
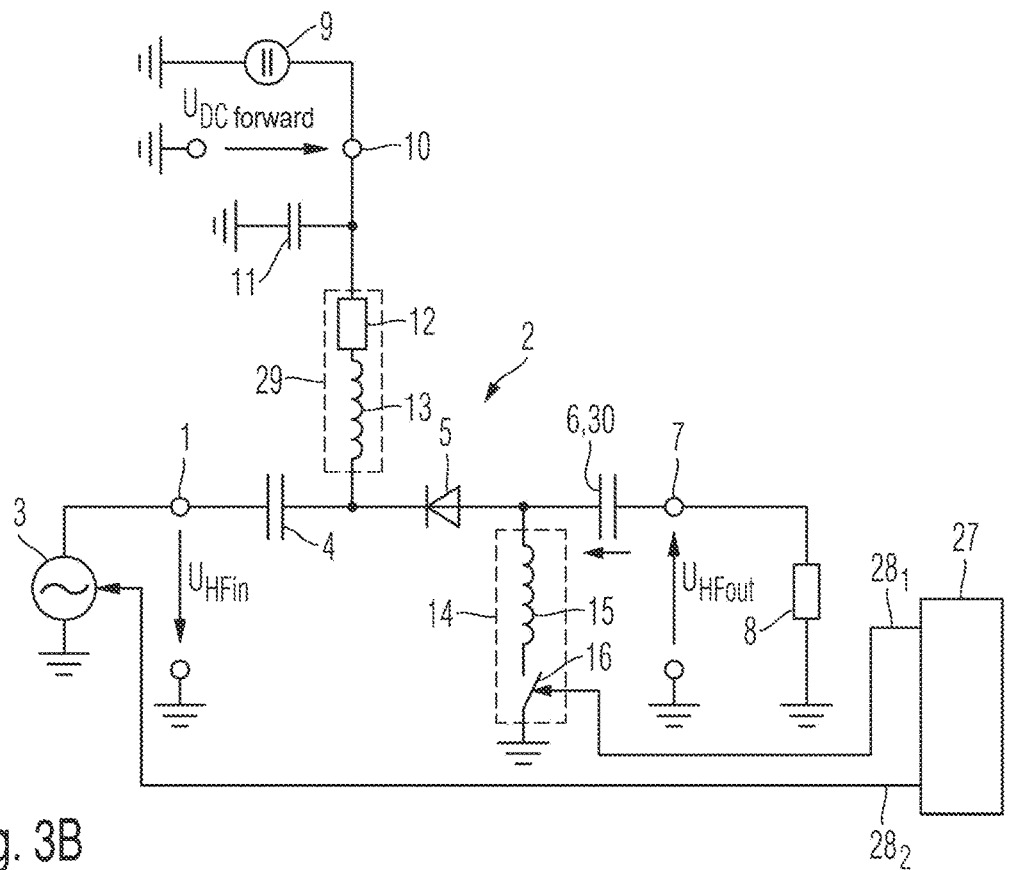
Figure 3C:
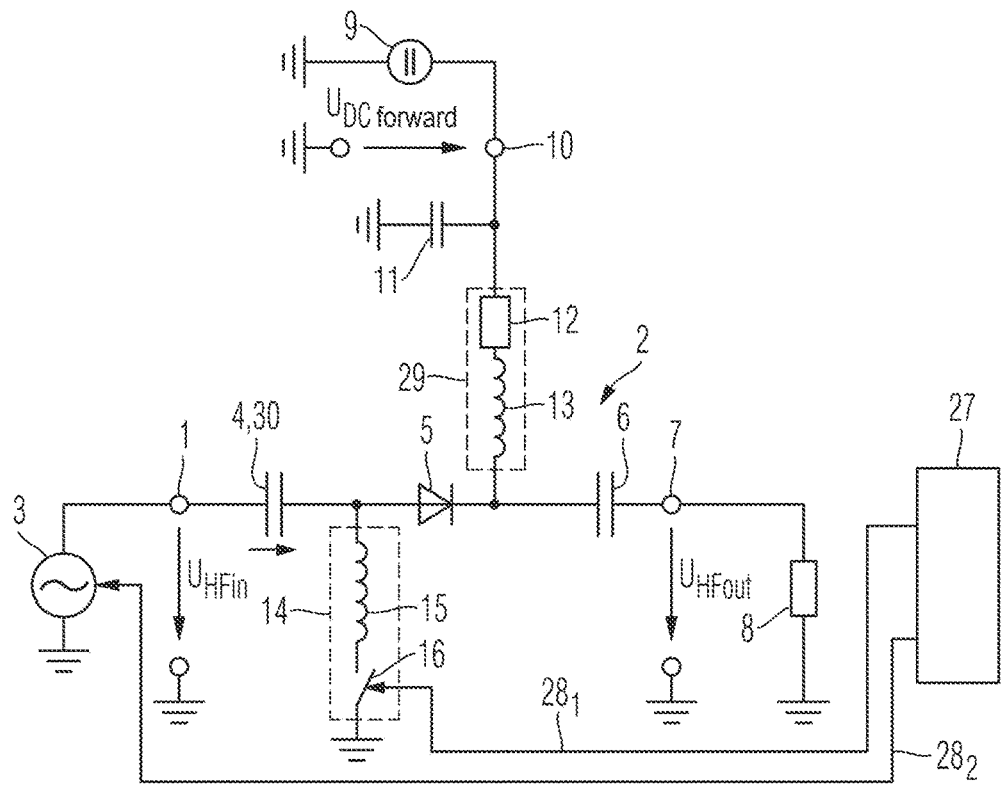
Figure 3D:
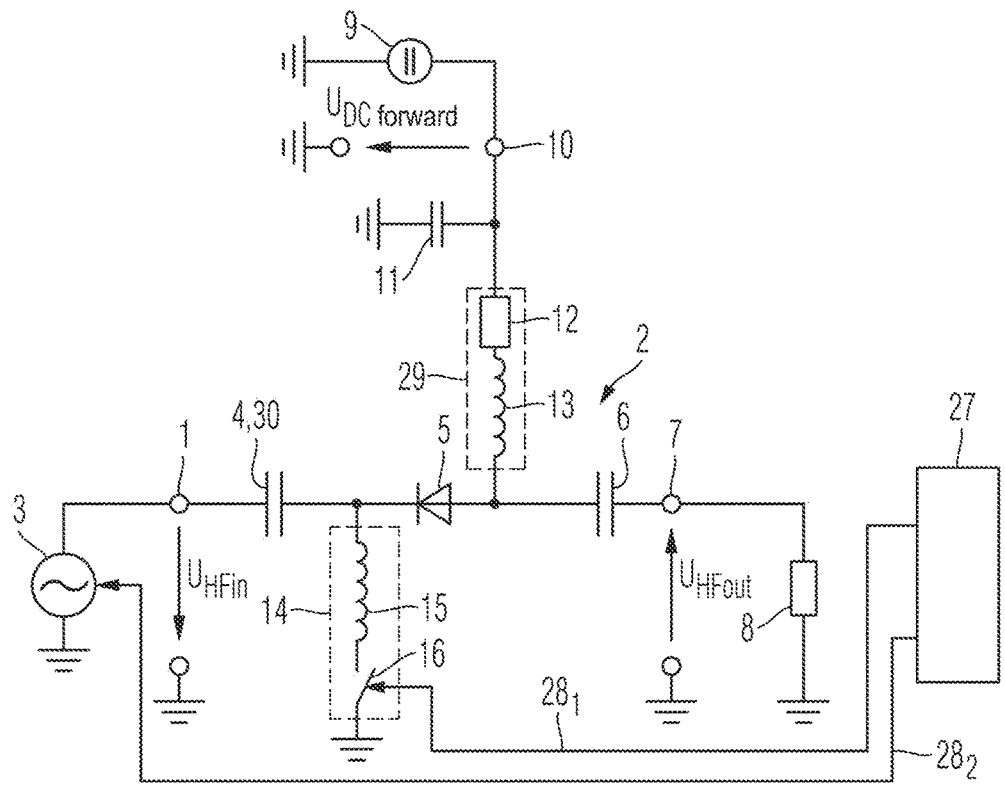
Figure 3E:
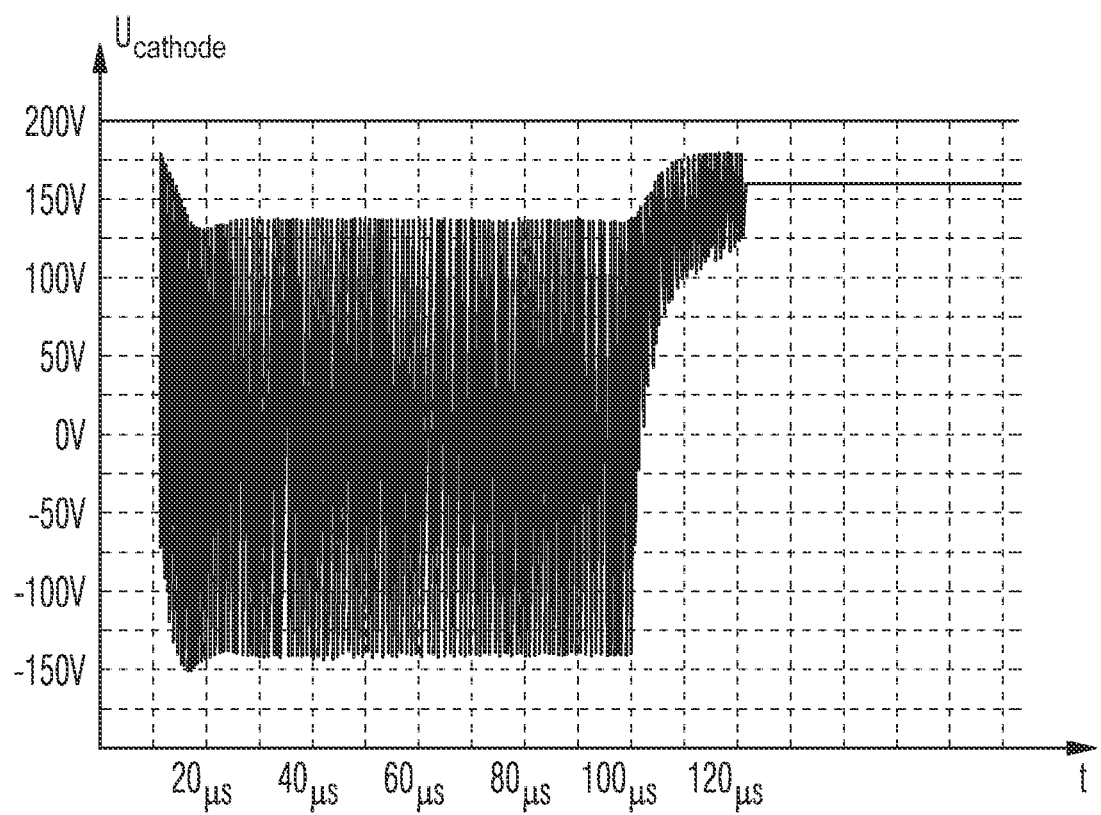
Figure 4A:
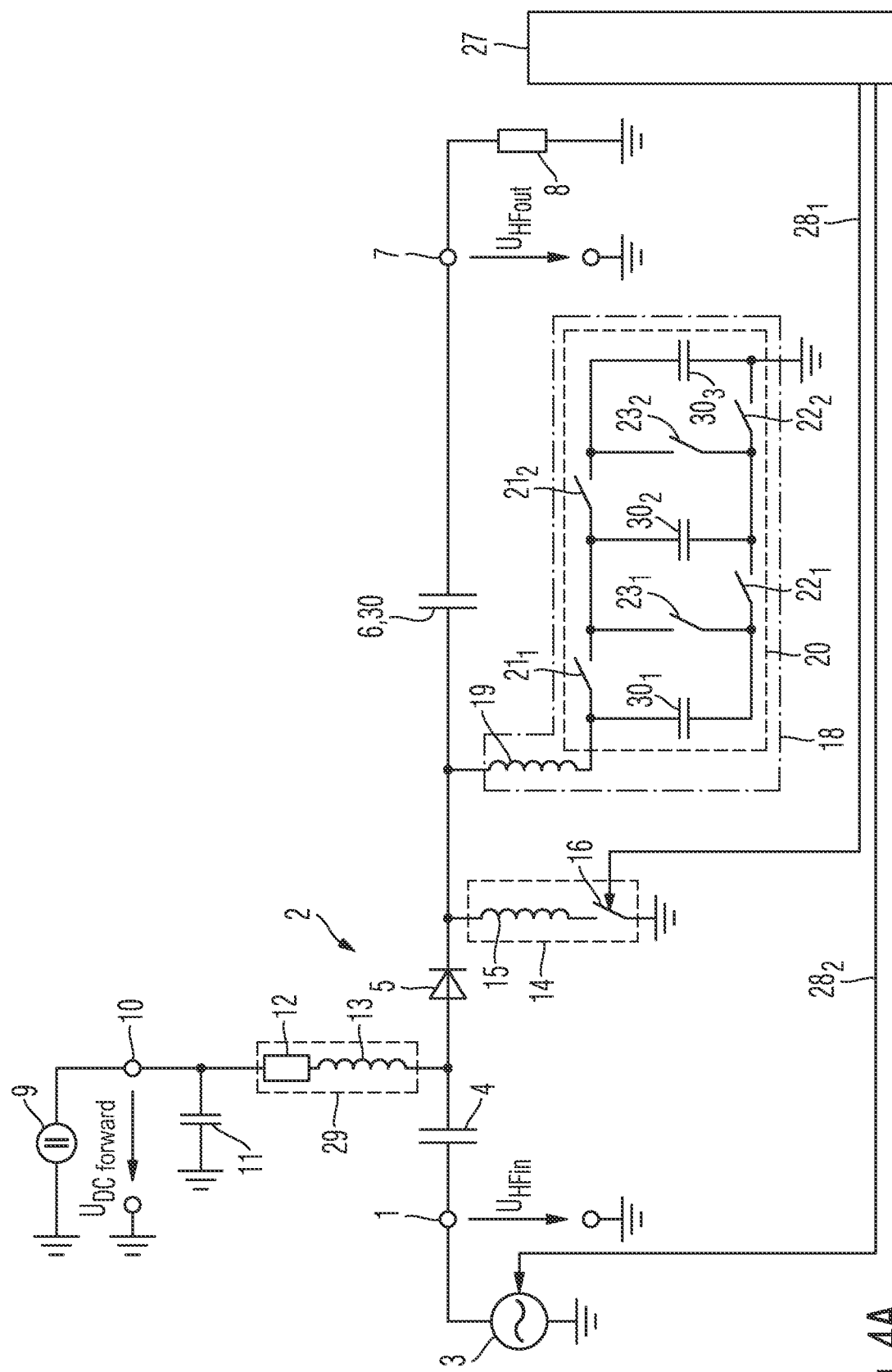
Figure 4B:
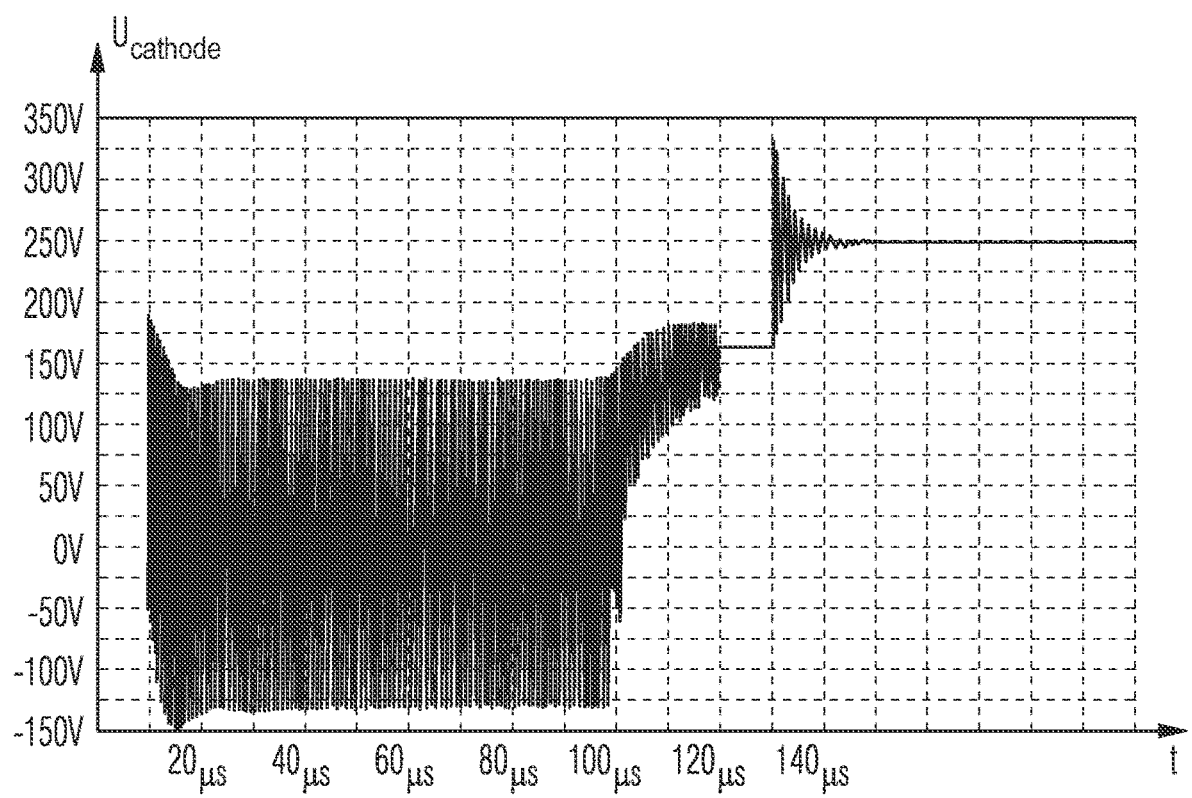
Figure 5A:
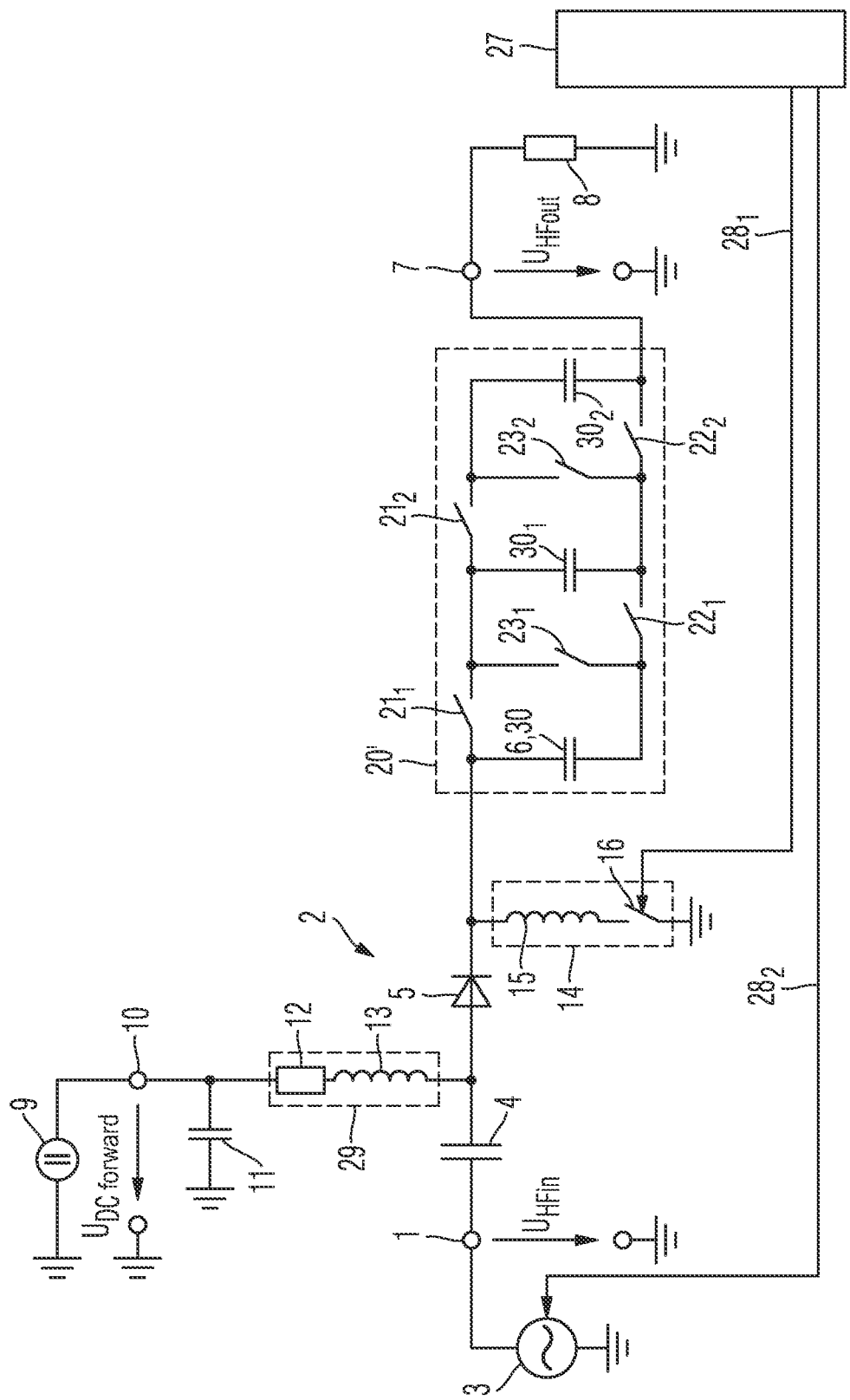
Figure 5B:
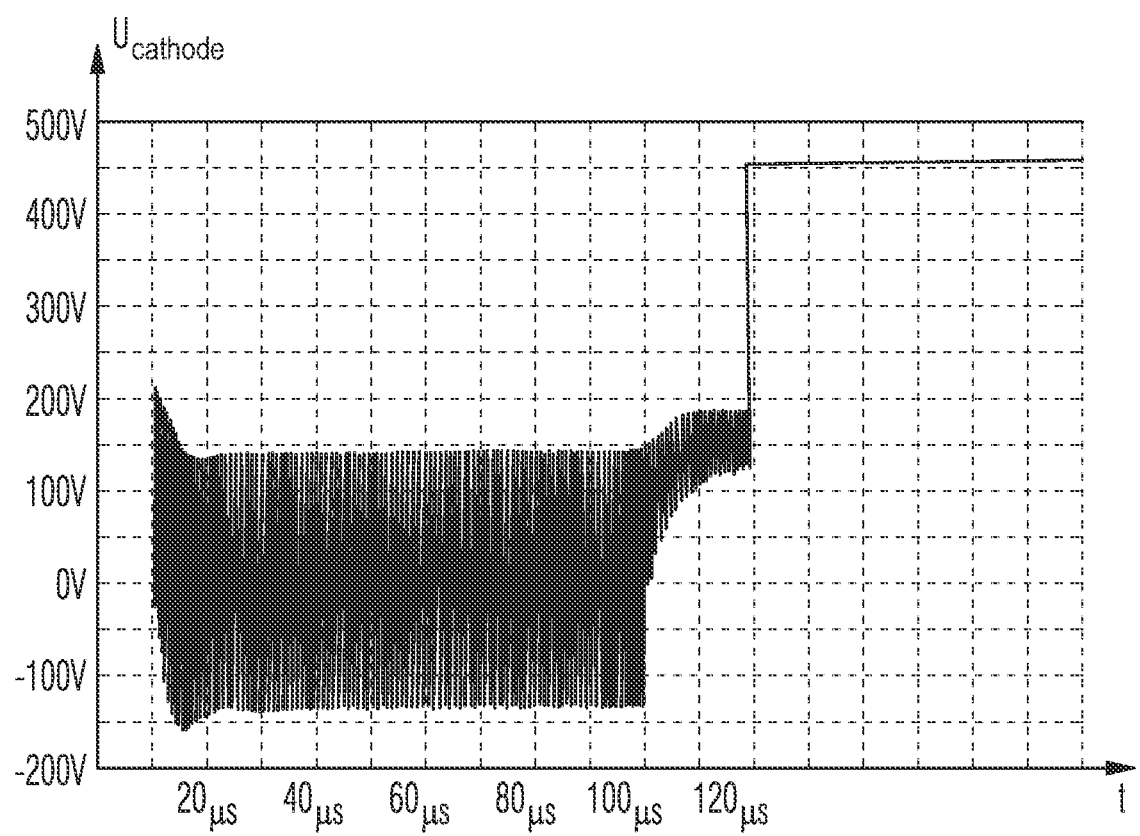
Figure 6A:
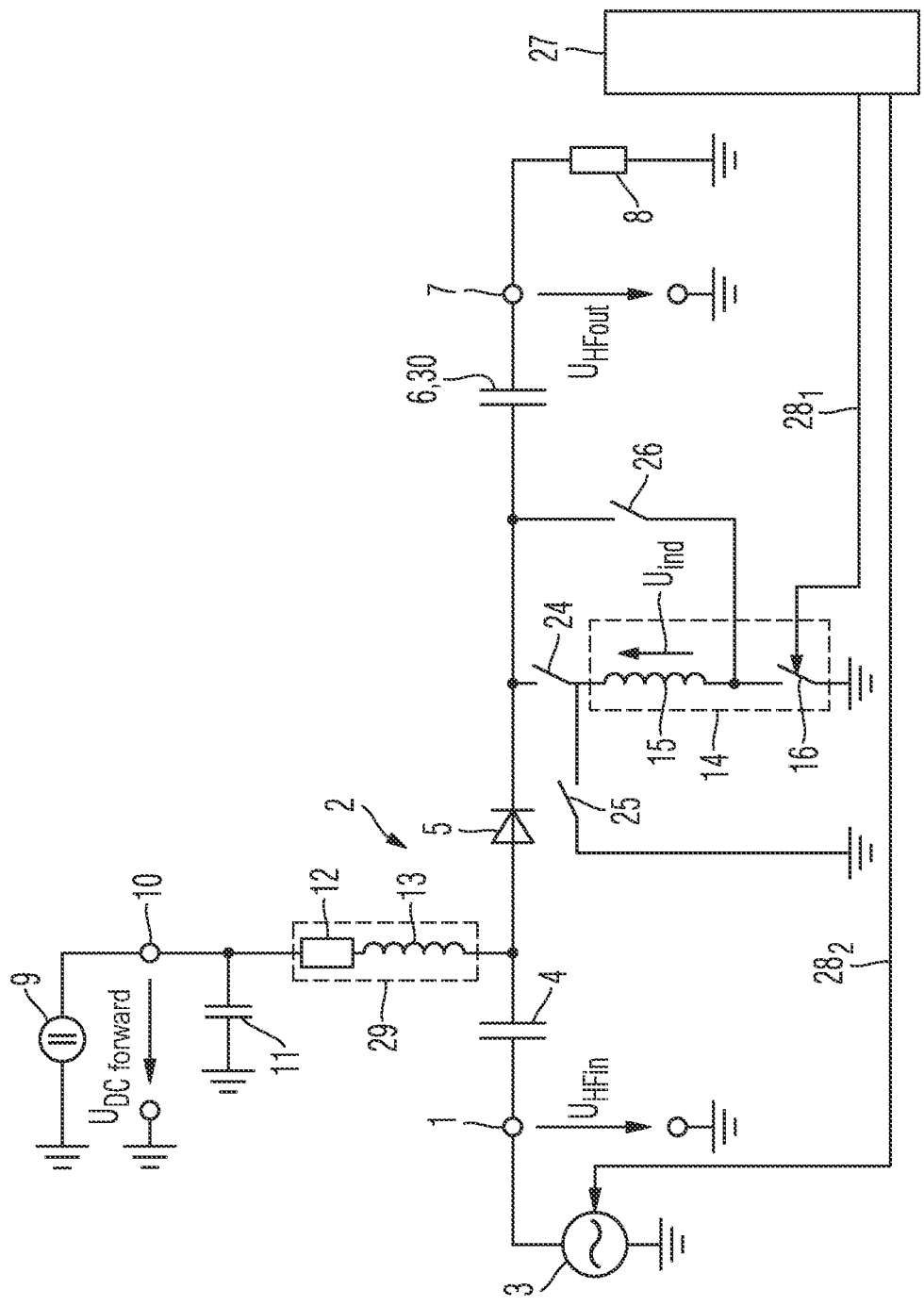
Figure 6B:
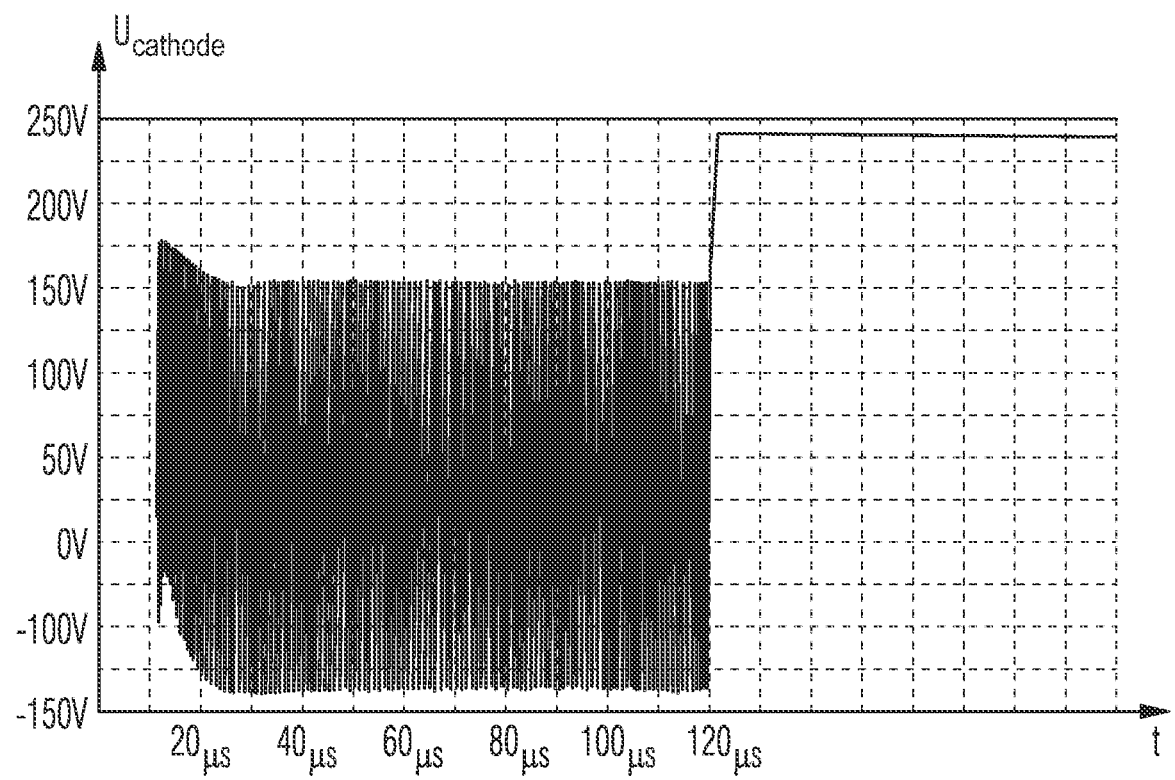
Figure 7:
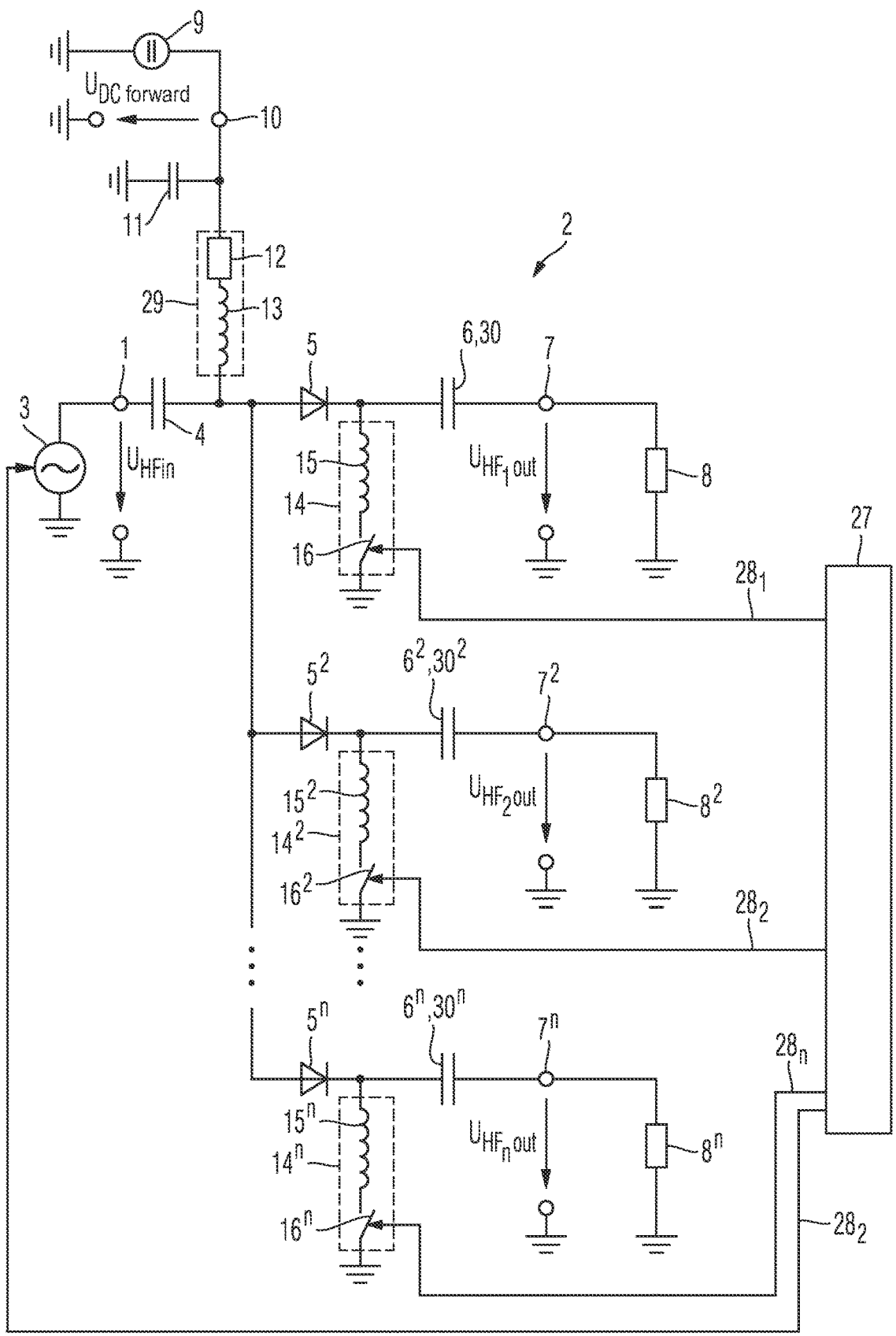

The present invention is explained in more detail below with reference to the exemplary embodiments specified in the schematic figures of the drawing, in which:

FIG. 1 shows an illustration of a circuit for switching an AC voltage according to the prior art, FIG. 2A shows an illustration of a characteristic curve of a p-n or PIN diode according to the prior art, FIG. 2B shows a timing diagram of the AC current through a PIN diode in forward operation, FIG. 2C shows a timing diagram of a low-frequency AC current through a p-n diode in the transition to reverse operation, FIG. 2D shows a timing diagram of a higher-frequency AC current through a PIN diode in the transition to reverse operation, FIG. 3A shows an illustration of a first variant of the circuit of the present disclosure for switching an AC voltage, FIG. 3B shows an illustration of a second variant of the circuit of the present disclosure for switching an AC voltage, FIG. 3C shows an illustration of a third variant of the circuit of the present disclosure for switching an AC voltage, FIG. 3D shows an illustration of a fourth variant of the circuit of the present disclosure for switching an AC voltage, FIG. 3E shows a timing diagram of the AC current in a circuit of the present disclosure for switching an AC voltage, FIG. 4A shows an illustration of a first development of the circuit of the present disclosure for switching an AC voltage, FIG. 4B shows a timing diagram of the AC current in a first development of the circuit of the present disclosure for switching an AC voltage, FIG. 5A shows an illustration of a second development of the circuit of the present disclosure for switching an AC voltage, FIG. 5B shows a timing diagram of the AC current in a second development of the circuit of the present disclosure for switching an AC voltage, FIG. 6A shows an illustration of a third development of the circuit of the present disclosure for switching an AC voltage, FIG. 6B shows a timing diagram of the AC current in a third development of the circuit of the present disclosure for switching an AC voltage, and FIG. 7 shows an illustration of a fourth development of the circuit of the present disclosure for switching an AC voltage.

The accompanying figures of the drawing are intended to convey a further understanding of the embodiments of the invention. They illustrate embodiments and, in association with the description, serve to clarify principles and concepts of the invention. Other embodiments and many of the advantages mentioned become apparent with regard to the drawings. The elements of the drawings are not necessarily shown in a manner true to scale with respect to one another.

In the figures of the drawing, identical, functionally identical and identically acting elements, features and components—unless explicitly stated otherwise—are provided in each case with the same reference signs.

In the following text, the figures are described in an interrelated and all-encompassing manner.

DESCRIPTION OF EXEMPLARY EMBODIMENTS

The four variants of a circuit according to the invention for switching an AC voltage are explained in detail below with reference to FIGS. 3A to 3D:

An AC voltage source 3 is connected to the input terminal 1 of the circuit 2 for switching an AC voltage. The AC voltage source 3 is preferably a voltage source for generating a high-frequency voltage. This may be for example a frequency oscillator or any other high-frequency circuit that generates a high-frequency voltage with a specific settable or fixed frequency and a specific settable or fixed amplitude.

This AC voltage source 3 or voltage source for generating a high-frequency voltage impresses a specific AC voltage or high-frequency voltage into the circuit 2 for switching an AC voltage. As an alternative, an AC current source or a current source for generating a high-frequency current with a parallel-connected resistor are also conceivable, by way of which an AC voltage or a high-frequency voltage is also able to be impressed into the circuit.

The input terminal 1 is connected to an input-side coupling capacitor 4 via which only an AC voltage, preferably the high-frequency voltage $U_{HFin}$, is able to be coupled into the circuit 2. The input-side coupling capacitor 4 likewise prevents a DC voltage from being coupled out from the circuit 2 in the direction of the AC voltage source 3.

In the first variant of the circuit, the input-side coupling capacitor 4 is connected to the anode of the diode 5, which is preferably a PIN diode 5. The cathode of the diode 5 is connected to an output-side coupling capacitor 6. In the first variant of the circuit, the output-side coupling capacitor 6 constitutes the capacitor 30 that serves as circuit for storing electrical charges. The series circuit comprising the diode 5 and the circuit for storing electrical charges is referred to below as first series circuit. The output-side coupling capacitor 6, that is to say the capacitor 30 serving as circuit for storing electrical charges, is finally connected to the (AC voltage) output terminal 7 of the circuit 2. The output-side coupling capacitor 6 couples only an AC voltage or a high-frequency voltage out from the circuit 2 and blocks a DC voltage. No DC voltage is able to be coupled into the circuit 2 via the output-side coupling capacitor 6 either.

The AC voltage or high-frequency voltage $U_{HFout}$ present at the output terminal 7 of the circuit 2 is connected to one terminal of a load impedance 8. The other terminal of the load impedance 8 is typically connected to a ground potential. The load impedance 8 may be any complex-value impedance. For an application of the circuit 2 for switching an AC voltage in the automotive sector, the load is for example an electrical spark plug connected to the circuit 2. The load impedance 8 consists in this case at least of the line impedance of the (high-frequency) supply line to the spark plug, the impedance of the inner conductor of the spark plug, stray capacitances and the impedance of the impedance respectively prevailing in the combustion chamber between the spark plug electrodes.

In order to switch the AC voltage or high-frequency voltage present at the input terminal 1 through to the output terminal 7 via the diode 5, which is preferably a PIN diode 5, a sufficient diode DC current $I_{DCforward}$ is required in the forward direction of the diode 5. In this case, the AC voltage or high-frequency voltage $U_{HFin}$ at the input is switched to an AC voltage or high-frequency voltage $U_{HFout}$ at the output of the circuit 2.

This diode DC current $I_{DCforward}$ is preferably generated in a DC voltage source 9. This DC voltage source 9 generates a DC voltage $U_{DCforward}$ at a further input terminal 10 of the circuit 2, a DC voltage input terminal. The further input terminal 10 is connected to the terminal of a shunt capacitor 11, whose other terminal is connected to the ground potential. The shunt capacitor 11 is connected as a stabilizing capacitor and filters low-frequency or higher-frequency interfering signals occurring at the further terminal 10 out of the DC voltage $U_{DCforward}$ generated by the DC voltage source 9.

In order to generate a diode DC current $I_{DCforward}$, the further input terminal 10 is connected to a resistor 12. The resistor 12 is dimensioned such that, in the case of a DC voltage $U_{DCforward}$ generated by the DC voltage source 9, the required diode DC current $I_{DCforward}$ flows through the resistor 12. In addition to generating the diode DC current $I_{DCforward}$ in a DC voltage source 9 and a downstream resistor 12, the diode DC current $I_{DCforward}$ may alternatively also be generated in a DC current source.

In the first variant of the circuit, the diode DC current $I_{DCforward}$ is impressed into the diode 5 by virtue of the DC voltage source 5 being connected to the electrical connection between the input terminal 1 and the anode of the diode 5. The DC voltage source 9 is connected to the electrical connection between the input terminal 1 and the anode of the diode 5 via the resistor 12 and the downstream second coil 13. As an alternative, the resistor 12 and the second coil 13 may also be interchanged in terms of their order within the series circuit 29. This second coil 13 makes it possible to feed the diode DC current $I_{DCforward}$ into the diode 5 with low resistance. The second coil 13 furthermore prevents the AC voltage, preferably the high-frequency voltage, from being coupled out from the circuit 2 in the direction of the DC voltage source 9.

As an alternative, instead of the second coil, any circuit with a low-pass filter characteristic or a circuit with a resistor that has a certain inductance at higher frequencies, for example a bonding wire or a strip line implemented as a butterfly stub, may be used.

In order to allow a current flow for the diode DC current $I_{DCforward}$ from the DC voltage source 9 through the diode 5 up to a reference potential, the electrical connection between the diode 5 and the capacitor 30 serving as circuit for storing electrical charges should be implemented as an electrical connection to the reference potential. The reference potential in FIG. 3A is for example the ground potential of the circuit. To this end, a series circuit 14 comprising a first coil 15 and a first switch 16 is connected between the ground potential and the electrical connection between the diode 5 and the capacitor 30. In this case, as illustrated in FIG. 3A, the first coil 15 may be connected to the cathode of the diode 5 and the first switch 16 may be connected to the ground potential. As an alternative, an electrical connection of the first switch 16 to the cathode of the diode 5 and the first coil 15 to the ground potential is also possible.

The first coil 15 in turn enables low-resistance coupling-out of the diode DC current $I_{DCforward}$ from the circuit 2 in the direction of the ground potential. In addition, the first coil 15 prevents the AC voltage or the high-frequency voltage from being short-circuited from the cathode of the diode 5 to the ground potential.

The first switch 16 is driven by a control circuit 27 via a signal transmission path $28_1$. The signal transmission path $28_1$ may be implemented in either wired or radio-supported form. In forward operation of the diode 5 or the PIN diode 5, the first switch 16 is closed, while it is open in reverse operation.

When the first switch 16 is closed in forward operation of the diode 5 or the PIN diode 5, this results in a diode current which results, according to FIG. 2B, from the superposition of the diode DC current $I_{DCforward}$ and the diode AC current IHF impressed by the AC voltage or the high-frequency voltage $U_{HFin}$. In this case, there is a potential, which is dependent on the reference potential or ground potential, in the electrical connection between the diode 5 and the capacitor 30.

When the first switch 16 is open and in the case of delayed switching off of the diode AC current—what is called "afterburn" of the AC voltage or the high-frequency voltage—this results, in the transition between forward and reverse operation at a lower frequency of the fed-in AC current according to FIG. 2C, in an overall diode current that decays with a time constant and at the same time has gaps in the current flow.

At a higher frequency of the fed-in AC current, this results, in the transition between forward and reverse operation according to FIG. 2D, in an overall diode current that decays with a time constant without gaps in the current flow.

The "afterburn time" of the AC voltage or the high-frequency voltage should be suitably matched to the time constant of the decay of the overall diode current. If the AC voltage or the high-frequency voltage is switched off without an "afterburn time" and thus at the same time as the DC voltage, then only the profile of the diode DC current illustrated in dashed form in each of FIGS. 2C and 2D results as decay of the diode current. Depending on the parameters of the diode 5 or the PIN diode 5, the diode DC current may under some circumstances be too low to charge the first capacitor 6 to a sufficient capacitor voltage level to block the diode 5. In this case, a sufficient "afterburn time" of the AC voltage or the high-frequency voltage is required to block the diode 5.

The time constant of the decay of the diode current is essentially dependent on the forward resistance of the diode 5 and the capacitance of the capacitor 30. By choosing the appropriate diode 5 or PIN diode 5 and thus the forward resistance of the diode 5 and the capacitance of the capacitor 30, the time constant is able to be suitably dimensioned. It should be noted here that the choice of capacitance for the capacitor 30 for a given diode current value, that is to say the amount of charge carriers transported to the capacitor 30, determines the reverse voltage able to be achieved for the diode 5. A sensible compromise between blocking that is as fast as possible and blocking that is as reliable as possible should thus be chosen through a suitable choice of parameters.

The control circuit 27 may switch the first switch 16 on again as early as possible when the transient process from forward operation to reverse operation of the diode 5 is definitely completed. This is the case when the voltage potential in the electrical connection between the diode 5 and the capacitor 30, which represents the circuit for storing electrical charges, is greater than the DC voltage $U_{DCforward}$ generated by the voltage source 9. In this case, a sufficient blocking potential is present at the cathode of the diode 5. If a plurality of DC voltage sources are integrated in the circuit for switching an AC voltage, which DC voltage sources may influence blocking of the diode 5, then the first switch 16 is able to be switched on again by the control circuit 27 as early as possible only when the voltage potential in the electrical connection between the diode 5 and the capacitor 30 is greater than the highest voltage of all of the voltages that are generated by in each case all of the DC voltage sources implemented in the circuit.

The control circuit 27 switches the AC voltage source 3 on and off via the signal transmission path $28_2$. The control circuit 27 in particular switches off the AC voltage source 3 with a delay in relation to the opening of the first switch 16. This "afterburn" of the AC voltage is ended at the latest via the control circuit 27 by switching off the AC voltage source 3 when the voltage potential in the electrical connection between the diode 5 and the capacitor 30 is greater than the highest of all of the DC voltages generated by the DC voltage sources implemented in the circuit.

In summary, it may thus be stated that, in the first variant in forward operation of the diode 5, this results in a current flow or a DC current flow path from the voltage source 9 via the diode 5 plus external wiring elements to the ground potential or reference potential that is electrically connected to the first switch 16. After the first switch 16 has been opened, the capacitor 30 charges via the electrical charges flowing in the transient phase to a capacitor voltage, the polarity of which is illustrated in FIG. 3A and puts the diode 5 into reverse operation.

In a second variant of the circuit for switching an AC voltage according to FIG. 3B, the DC voltage source 9 for impressing a DC current into the diode 5 is likewise connected, as in the first variant, to the electrical connection between the input terminal 1 and the diode 5. The diode 5, which is preferably designed as a PIN diode 5, has opposing polarity in the second variant compared to the first variant. The cathode of the diode 5 is in this case electrically connected to the input terminal 1 via an electrical connection and the anode is electrically connected to the output terminal 7 via an electrical connection. The DC voltage source 9 is thus electrically connected to the cathode of the diode 5. In addition, the DC voltage source 9 has opposing polarity in the second variant compared to the DC voltage source 9 in the first variant. The DC voltage $U_{DCforward}$ generated by the DC voltage source 9 thus drops from the ground potential to the further input terminal 10.

Thus, in the second variant in forward operation of the diode 5, this results in a current flow or a DC current flow path from the ground potential or reference potential, which is electrically connected to the first switch 16, via the diode 5 plus external wiring elements to the DC voltage source 9. After the first switch 16 has been opened, the capacitor 30 charges via the electrical charges flowing in the transient phase to a capacitor voltage, the polarity of which is illustrated in FIG. 3B and puts the diode 5 into reverse operation.

In a third variant of the circuit for switching an AC voltage according to FIG. 3C, the DC voltage source 9 is connected to the electrical connection between the output terminal 7 and the diode 5 in order to impress a DC current into the diode 5. In the third variant, the anode of the diode 5 is electrically connected to the input terminal 1 via an electrical connection and the cathode is electrically connected to the output terminal 7 via an electrical connection. The DC voltage source 9 is thus electrically connected to the cathode of the diode 5. The first switch 16 is furthermore connected to the electrical connection between the anode of the diode 5 and the input-side coupling capacitor 4, with or without the interposition of a circuit with a low-pass filter characteristic or a circuit with a resistor. This input-side coupling capacitor 4 serves, in the third variant, as capacitor 30 for implementing the circuit for storing electrical charges. The DC voltage source 9 has a polarity such that the DC voltage $U_{DCforward}$ generated thereby is directed from the ground potential to the further input terminal 10.

Thus, in the third variant in forward operation of the diode 5, this results in a current flow or a DC current flow path from the ground potential or reference potential, which is electrically connected to the first switch 16, via the diode 5 plus external wiring elements to the DC voltage source 9. After the first switch 16 has been opened, the input-side coupling capacitor 4, which serves as capacitor 30 for implementing the circuit for storing electrical charges, is charged to a capacitor voltage via the electrical charges flowing in the transient phase. The polarity of the capacitor voltage is illustrated in FIG. 3C and puts the diode 5 into reverse operation.

In a fourth variant of the circuit for switching an AC voltage according to FIG. 3D, the DC voltage source 9 for impressing a DC current into the diode 5 is likewise connected, as in the third variant, to the electrical connection between the diode 5 and the output terminal 7. The diode 5, which is preferably designed as a PIN diode 5, has opposing polarity in the fourth variant compared to the third variant. In the fourth variant, the cathode of the diode 5 is electrically connected to the input terminal 1 via an electrical connection and the anode is electrically connected to the output terminal 7 via an electrical connection. The DC voltage source 9 is thus electrically connected to the anode of the diode 5. In addition, the DC voltage source 9 has opposing polarity in the fourth variant compared to the DC voltage source 9 in the third variant. The DC voltage $U_{DCforward}$ generated by the DC voltage source 9 thus drops from the further input terminal 10 to the ground potential. The first switch 16 is connected, in the fourth variant, to the electrical connection between the cathode of the diode 5 and the input-side coupling capacitor 4, with or without the interposition of a circuit with a low-pass filter characteristic or a circuit with a resistor. This input-side coupling capacitor 4 serves, in the fourth variant, as capacitor 30 for implementing the circuit for storing electrical charges.

This thus results, in the fourth variant in forward operation of the diode 5, in a current flow or a DC current flow path from the DC voltage source 9 via the diode 5 plus external wiring elements to the ground potential or reference potential that is electrically connected to the first switch 16. After the first switch 16 has been opened, the capacitor 30 charges via the electrical charges flowing in the transient phase to a capacitor voltage, the polarity of which is illustrated in FIG. 3D and puts the diode 5 into reverse operation.

The timing diagram of FIG. 3E, by way of example for the first variant of the circuit, illustrates the voltage at the cathode of the diode 5 with respect to ground potential. In this case, at the time t=10 μsec, a DC voltage of 12 V and an AC voltage with an amplitude of 150 V are switched on at the same time. When the diode 5 is switched through, a DC voltage of approx. 0.3 V is present at the cathode of the diode 5 and has superimposed on it an AC voltage with an amplitude of approx. 150 V. At the time t=100 μsec, the DC forward path is opened, while the AC voltage remains switched on until the time t=120 μsec. After the DC forward path has been opened, the first capacitor 6 is charged, with the AC voltage still switched on, to a voltage of approx. 160 V, which serves as reverse voltage for the final blocking of the diode 5.

FIG. 4A shows a first development of the circuit 2 for switching an AC voltage:

In the first development of the circuit 2, a series circuit 18 comprising a third coil 19 and an interconnection 20 of further capacitors $30_1$, $30_2$ and $30_3$ is connected between the electrical connection that connects the cathode of the diode 5, preferably a PIN diode 5, to the capacitor 6, and a ground potential. The series circuit comprising a third coil 19 and an interconnection 20 of further capacitors $30_1$, $30_2$ and $30_3$ is referred to below as second series circuit. In this case, the third coil 19, as illustrated in FIG. 4A, may be connected to the cathode of the diode 5 and the capacitor 6, while the interconnection 20 of further capacitors $30_1$, $30_2$ and $30_3$ is connected to the ground potential. As an alternative, the interconnection 20 of further capacitors $30_1$, $30_2$ and $30_3$ may be connected to the cathode of the diode 5 and the first capacitor 6, while the third coil 19 is connected to the ground potential.

The third coil 19 prevents short-circuiting of the AC voltage from the cathode of the diode 5 via the interconnection 20 of further capacitors $30_1$, $30_2$ and $30_3$ to the ground potential. The third coil 19 furthermore enables the further capacitors $30_1$, $30_2$ and $30_3$ to be charged with low resistance by the diode DC current.

The capacitor 30, which is formed by the output-side coupling capacitor 6, and the further capacitors $30_1$, $30_2$ and $30_3$ form a circuit for storing electrical charges.

The further capacitors $30_1$, $30_2$ and $30_3$ may be connected in a parallel configuration or alternatively in a series configuration. In order to implement the parallel configuration of the further capacitors $30_1$, $30_2$ and $30_3$, a respective second switch $21_1$ and $21_2$ is provided between the terminals of the further capacitors $30_1$, $30_2$ and $30_3$ on the cathode side, that is to say in the electrical connection to the cathode of the diode 5, and a respective third switch $22_1$ and $22_2$ is provided between the terminals of the further capacitors $30_1$, $30_2$ and $30_3$ on the side of the ground potential, that is to say in the electrical connection to the ground potential. In the parallel configuration of the further capacitors $30_1$, $30_2$ and $30_3$, the individual second switches $21_1$ and $21_2$ and the individual third switches $22_1$ and $22_2$ are closed by being driven via the control circuit 27.

A respective fourth switch $23_1$ and $23_2$ is connected between two terminals of two further capacitors $30_1$, $30_2$ and $30_3$. These fourth switches $23_1$ and $23_2$ are each open in the parallel configuration of the further capacitors $30_1$, $30_2$ and $30_3$, while they are each closed in the series configuration of the further capacitors $30_1$, $30_2$ and $30_3$. In the series configuration of the further capacitors $30_1$, $30_2$ and $30_3$, the individual second switches $21_1$ and $21_2$ and the individual third switches $22_1$ and $22_2$ are each open. The second switches $21_1$ and $21_2$, the third switches $22_1$ and $22_2$ and the fourth switches $23_1$ and $23_2$ are driven via the control circuit 27 by way of associated signal transmission paths, which are not shown in FIG. 4A for the sake of clarity.

The number of further capacitors $30_1$, $30_2$ and $30_3$ is not set at three capacitors, as illustrated in FIG. 4A. Rather, any other technically sensible number of further capacitors $30_1$, $30_2$ and $30_3$ is possible.

In forward operation of the diode 5 or the PIN diode 5, all of the second switches $21_1$ and $21_2$, all of the third switches $22_1$ and $22_2$ and all of the fourth switches $23_1$ and $23_2$ are each open. The interconnection 20 of further capacitors $30_1$, $30_2$ and $30_3$ is thus decoupled from the cathode of the diode 5. Thus, starting from the time t=10 μsec, an AC voltage with an amplitude of approx. 150 V with respect to ground potential is present at the cathode of the diode 5.

After the DC forward path has been opened at the time t=100 μsec, the further capacitors $30_1$, $30_2$ and $30_3$ are each connected in parallel with one another and thus also connected in parallel with the capacitor 30 via the third coil 19. The capacitor 30 and the further capacitors $30_1$, $30_2$ and $30_3$ are thus each charged to the same capacitor voltage. Due to the parallel connection of the individual capacitors, this charging process takes place, in the first development of the circuit 2 according to FIG. 4A, with a higher time constant than in the basic circuit 2 according to FIG. 3A. Each capacitor voltage, and thus also the cathode voltage of the diode 5, after this charging process, at the time t=120 μsec at which the AC voltage is then also switched off, thus reaches a DC voltage value of approx. 160 V.

At the time t=130 μsec, there is a changeover between the parallel configuration and the series configuration of the further capacitors $30_1$, $30_2$ and $30_3$. The capacitor voltage across all three series-connected further capacitors $30_1$, $30_2$ and $30_3$ thereby increases threefold to approx. 480 V. Since the parallel-connected capacitor 30 still has a capacitor voltage of 160 V, this results in a balancing process between the capacitor 30 and the further capacitors $30_1$, $30_2$ and $30_3$. This balancing process, which may be seen in FIG. 4B, owing to the series circuit consisting of the third coil 19 and the capacitor 30, caused by a transient process between the two times t=130 μsec and t=150 μsec, leads to a balanced capacitor voltage of the capacitor 30 and the series-connected further capacitors $30_1$, $30_2$ and $30_3$. This balanced capacitor voltage, which serves to block the diode 5, is approximately 250 V, as may be seen in FIG. 4B. This reverse voltage value is thus advantageously increased in comparison with that in the basic circuit in accordance with the present disclosure.

By dimensioning the capacitance of the further capacitors $30_1$, $30_2$ and $30_3$, which is preferably the same in each case, in relation to the capacitance of the capacitor 30, the level of the reverse voltage able to be achieved is able to be set. However, since the capacitances also influence the time constant of the charging process, a sensible compromise between reliable blocking and blocking that is as fast as possible should be chosen here.

FIG. 5A illustrates a second and preferred development of the circuit 2 for switching an AC voltage:

An interconnection 20' consisting of a capacitor 30, which is formed with the output-side coupling capacitor 6, and further capacitors $30_1$ and $30_2$ is connected between the cathode of the diode 5 or the PIN diode 5 and the output terminal 7 of the circuit 2. The capacitor 30 formed from the output-side coupling capacitor 6 and the further capacitors $30_1$ and $30_2$ form the circuit for storing electrical charges.

In a parallel arrangement, the capacitor 30 is able to be connected in parallel with the further capacitors $30_1$ and $30_2$. To this end, a respective second switch $21_1$ and $21_2$ is connected between the cathode-side terminals of the capacitor 30 and the further capacitors $30_1$ and $30_2$, and a respective third switch $22_1$ and $22_2$ is connected between the terminals of the capacitor 30 and the further capacitors $30_1$ and $30_2$ on the side of the output terminal 7. In this case, the cathode-side terminals are in each case the terminals in the electrical connection to the cathode of the diode 5 and the terminals on the side of the output terminal 7 are in each case the terminals in the electrical connection to the output terminal 7. A respective fourth switch $23_1$ and $23_2$ is connected between the terminals of the capacitor 30 and the further capacitors $30_1$ and $30_2$. In the parallel configuration of the capacitor 30 and the further capacitors $30_1$ and $30_2$, the second switches $21_1$ and $21_2$ and the third switches $22_1$ and $22_2$ are closed by being driven by the control circuit 27. The fourth switches $23_1$ and $23_2$ are each open in the parallel configuration.

In the series configuration of the capacitor 30 and the further capacitors $30_1$ and $30_2$, the fourth switches $23_1$ and $23_2$ are each closed, while the second switches $21_1$ and $21_2$ and the third switches $22_1$ and $22_2$ are each open.

The second switches $21_1$ and $21_2$, the third switches $22_1$ and $22_2$ and the fourth switches $23_1$ and $23_5$ are likewise driven via the control circuit 27 by way of associated signal transmission paths, which are not shown in FIG. 5A for the sake of clarity.

The number of further capacitors $30_1$ and $30_2$ is not set at two capacitors, as illustrated in FIG. 4A. Rather, any other technically sensible number of further capacitors $30_1$ and $30_2$ is possible.

As may be seen from the temporal profile of the cathode voltage of the diode 5 with respect to ground potential in FIG. 5B, when the diode 5 or the PIN diode 5 is in forward operation, an AC voltage with an amplitude of 150 V with respect to ground potential is present at the cathode of the diode 5 starting from the time t=10 μsec.

When the DC voltage is switched off while the AC voltage is still switched on at the time t=100 μsec, the capacitor 30 and, in parallel, the respectively parallel-connected further capacitors $30_1$ and $30_2$ are charged. Due to the parallel connection of the capacitor 30 and the further capacitors $30_1$ and $30_2$, the charging takes place with a higher time constant. The higher time constant means that the capacitor 30 and the further capacitors $30_1$ and $30_2$ are each charged, at the time t=120 μsec, the end of the charging process, to a capacitor voltage that is lower than the capacitor voltage of the capacitor 30 of the basic circuit 2 at the same time. The cathode voltage of the diode 5 at the time t=120 μsec is approx. 150 V in the second development of the circuit 2 according to FIG. 5B, while the cathode voltage of the diode 5 in the basic circuit in accordance with the present disclosure is approx. 160 V according to FIG. 3C.

As soon as the capacitor 30 and the further capacitors $30_1$ and $30_2$ are charged at the time t=120 μsec and the AC voltage is also switched off, there is a changeover between the parallel configuration and the series configuration of the capacitor 30 and the further capacitors $30_1$ and $30_2$. This changeover to the series configuration leads to the individual capacitor voltages of the capacitor 30 and the further capacitors $30_1$ and $30_2$ being summed. This thus results in a reverse voltage of approx. 450 V at the cathode of the diode 5 in the second development of the circuit 2 according to FIG. 5B.

In a third development of the circuit 2 for switching an AC voltage according to FIG. 6A, a fifth switch 24 is connected between the cathode of the diode 5 or the PIN diode 5 and the series circuit 14 consisting of the first coil 15 and the first switch 16. In addition, a sixth switch 25 is connected between the electrical connection that connects the fifth switch 24 to the first coil 15 and the ground potential. Finally, a seventh switch 26 connects the electrical connection that connects the first coil 15 to the first switch 16 to the cathode of the diode 5.

In forward operation of the diode 5 or the PIN diode 5, the first switch 16 and the fifth switch 25 are each closed starting from the time t=10 μsec. The sixth switch 25 and the seventh switch 26 are open starting from the time t=10 μsec.

The fifth switch 24, the sixth switch 25 and the seventh switch 26 are driven, like the driving of the first switch 16, by the control circuit 27 by way of associated signal transmission paths, which are not shown in FIG. 6A for the sake of clarity.

As may be seen in FIG. 6B, in forward operation of the diode 5 in the third development of the circuit 2, this results in an equivalent cathode voltage with respect to ground potential as in the basic circuit 2 in FIG. 3C. It corresponds to an AC voltage with an amplitude of approx. 150 V.

At the time t=120 μsec, the first switch 16 and the fifth switch 24 are opened and thus the DC forward path is opened and the AC voltage is switched off at the same time.

When the first switch 16 and the fifth switch 24 are opened at the time t=120 μsec, there is an abrupt current flow interruption in the first coil 15, which induces a voltage $U_{ind}$ in the first coil 15. The induction voltage $U_{ind}$ in the first coil 15 is directed opposite to the original current direction through the first coil 15. In order for this induction voltage $U_{ind}$ to be related to a reference potential after the fifth switch 24 is opened, the sixth switch 25 is preferably closed at the same time or at least close in time to the opening of the first switch 16 and the fifth switch 24.

The seventh switch 26 is furthermore preferably closed at the same time or at least close in time to the opening of the first switch 16 and the fifth switch 24 at the time t=120 μsec. When the seventh switch 26 is closed, the voltage $U_{ind}$ induced in the first coil 15 charges the output-side coupling capacitor 6 with the voltage induced in the first coil 15 to a capacitor voltage of approx. 240 V, as may be seen in FIG. 6B. The output-side coupling capacitor 6 in this case forms the capacitor 30 serving as a circuit for storing electrical charges.

In order that the capacitor 6 does not discharge from this capacitor voltage via the closed seventh switch 26, the first coil 15 and the closed sixth switch 25 to ground potential, the seventh switch 26 is closed again at a slightly later time t=132 μsec. The capacitor voltage of the capacitor 6 thus remains at its higher value of approx. 240 V, which is sufficient as a reverse voltage for reliably and independently blocking the diode 5 or the PIN diode 5.

FIG. 7 shows a fourth development of the circuit 2 for switching an AC voltage:

Like the basic circuit 2 in accordance with the present disclosure for switching an AC voltage according to FIG. 3A, the fourth development of the circuit 2 has an input terminal 1 to which an AC voltage source 3 is connected. At the input terminal 1, an AC voltage, preferably a high-frequency voltage $U_{HFin}$, is fed into the circuit.

The (AC voltage) input terminal 1 is connected to an input-side coupling capacitor 4 via which only an AC voltage, preferably the high-frequency voltage $U_{HFin}$, is able to be coupled into the circuit. The input-side coupling capacitor 4 likewise prevents a DC voltage from being coupled out from the circuit 2.

The input-side coupling capacitor 4 is in each case connected to a number n–1 of further diodes $5^2, \ldots, 5^n$, preferably further PIN diodes $5^2, \ldots, 5^n$. The interconnection of the further diodes $5^2, \ldots, 5^n$ corresponds to the interconnection of the diode 5 in the first variant of the basic circuit in accordance with the present disclosure. The input-side coupling capacitor is thus additionally connected to the anode of the further diodes $5^2, \ldots, 5^n$. As an alternative, the other variants of the basic circuit in accordance with the present disclosure may also be used in the fourth development of the circuit.

The cathode of the further parallel-connected diodes $5^2, \ldots, 5^n$ is connected in each case to an associated further output terminal $7^2, \ldots, 7^n$ via an associated output-side coupling capacitor $6^2, \ldots, 6^n$, which in each case constitutes the capacitor $30^2, \ldots, 30^n$ forming the respective circuit for storing electrical charges. A respective output-side AC voltage $U_{HF2out}, \ldots, U_{HFnout}$, preferably an output-side high-frequency voltage $U_{HF2out}, \ldots, U_{HFnout}$, is present at the respective further output terminal $7^2, \ldots, 7^n$. This output-side AC voltage $U_{HF2out}, \ldots, U_{HFnout}$ is fed to an associated further load impedance $8^2, \ldots, 8^n$. When using the fourth development of the circuit 2 in the automotive sector, the further load impedance $8^2, \ldots, 8^n$ corresponds for example to the impedance of the supply line to an electrical spark plug, the impedance of the inner conductor in the electrical spark plug and the impedance in the combustion chamber between the two spark plug electrodes.

A respective associated further series circuit $14^2, \ldots, 14^n$ consisting of an associated further coil $15^2, \ldots, 15^n$ and an associated further first switch $16^2, \ldots, 16^n$ is connected between the cathode of the further diodes $5^2, \ldots, 5^n$ and the ground potential. As an alternative to the further coil $15^2, \ldots, 15^n$, any other suitable circuit with a low-pass filter characteristic or any other suitable circuit with a resistor may also be used.

In order to switch the AC voltage or high-frequency voltage present at the input terminal 1 through to the output terminal 7 or to the further output terminal $7^2, \ldots, 7^n$ via the associated diode 5 or the associated further diode $5^2, \ldots, 5^n$, a sufficient diode DC current $I_{DCforward}$ in the forward direction of the diode 5 or the further diode $5^2, \ldots, 5^n$ is required.

This diode DC current $I_{DCforward}$ is generated for each diode 5 or each further diode $5^2, \ldots, 5^n$ by a single DC voltage source 9 at a further input terminal 10 of the circuit 2. The further input terminal 10 is connected via a shunt capacitor 11 to a resistor 12, which generates a diode DC current $I_{DCforward}$ from the DC voltage $U_{DCforward}$ present at the further input terminal 10. A second coil 13 is connected between the resistor 12 and the anode of the diode 5 or the further diode $5^2, \ldots, 5^n$. As an alternative to feeding in a DC voltage $U_{DCforward}$ using a DC voltage source 9, the diode DC current $I_{DCforward}$ may also be impressed directly by a DC current source 17.

For the individual components of the fourth development of the circuit 2 and their interconnection, what was stated above with regard to the equivalent components of the basic circuit 2 in accordance with the present disclosure for switching an AC voltage applies in an equivalent manner, and is therefore not explained again here.

In the fourth development of the circuit 2 according to FIG. 7, the control circuit 27 is connected, via individual signal transmission paths $28_1, 28^2, \ldots, 28^n$, in each case to the first switches 16 and the further first switches $16^2, \ldots, 16^n$. The control circuit 27 closes and opens the first switch 16 or the further first switches $16^2, \ldots, 16^n$ and thus puts the associated diode 5 or the associated further diode $5^2, \ldots, 5^n$ into forward operation or into reverse operation.

The control circuit 27 may switch the first switch 16 or the further first switches $16^2, \ldots, 16^n$ on again as early as possible when the transient process from forward operation to reverse operation of the diode 5 or the further diodes $5^2, \ldots, 5^n$ is definitely completed. This is the case when the voltage potential in the electrical connection between the diode 5 or the further diodes $5^2, \ldots, 5^n$ and the capacitor 30 or the further capacitors $30^2, \ldots, 30^n$, each of which constitutes the circuit for storing electrical charges, is greater than the DC voltage $U_{DCforward}$ generated by the voltage source 9. In this case, a sufficient reverse potential is present at the cathode of the diode 5 or the further diodes $5^2, \ldots, 5^n$.

If a plurality of DC voltage sources are integrated in the circuit for switching an AC voltage, which DC voltage sources may influence the blocking of the diode 5 or the further diodes $5^2, \ldots, 5^n$, then the first switch 16 or the further first switch $16^2, \ldots, 16^n$ is able to be switched on again as early as possible by the control circuit 27 only when the voltage potential in the electrical connection between the diode 5 or the further diodes $5^2, \ldots, 5^n$ and the capacitor 30 or the further capacitors $30^2, \ldots, 30^n$ is greater than the highest of all of the DC voltages generated by the DC voltage sources implemented in the circuit.

The control circuit 27, which switches the AC voltage source 3 on and off via the signal transmission path $28_2$, is able to switch the AC voltage source 3 off with a delay in relation to the opening of the first switch 16 or the further first switches $16^2, \ldots, 16^n$. This "afterburn" of the AC voltage is ended at the latest via the control circuit 27 by switching off the AC voltage source 3 when the voltage potential in the electrical connection between the diode 5 or the further diodes $5^2, \ldots, 5^n$ and the capacitor 30 or the further capacitors $30^2, \ldots, 30^n$ is greater than the highest voltage of all of the voltages that are each generated by DC voltage sources implemented in the circuit.

The cathode-side wiring of the diode 5 or the further diodes $5^2, \ldots, 5^n$ of the fourth development of the circuit 2 in FIG. 7, which corresponds to the cathode-side wiring of the diode 5 in the first variant of the basic circuit 2 in accordance with the present disclosure for switching an AC voltage according to FIG. 3A, may alternatively also be designed according to the cathode-side wiring of the diode 5 of the first, second or third development of the circuit 2 for switching an AC voltage according to FIGS. 4A, 5A and 6A. In these cases, the control circuit 27 needs to be supplemented with the drive system for the further switches that are required in this case.

In one preferred application, the AC voltage $U_{HFin}$ generated in the AC voltage source 3 is cyclically switched, and thus distributed, to the individual output terminals 7, $7^2, \ldots, 7^n$ in cyclic operation via diodes $5, 5^2, \ldots, 5^n$ that are cyclically switched to forward operation. In addition to cyclic operation, any desired technically sensible drive sequence for the individual diodes $5, 5^2, \ldots, 5^n$ is also possible. Finally, a plurality of diodes $5, 5^2, \ldots, 5^n$ may also be driven simultaneously, and the generated AC voltage $U_{HFin}$ may thus be switched, and thus distributed, to a plurality of output terminals $7, 7^2, \ldots, 7^n$ at the same time.

Although the present invention has been described completely above on the basis of preferred exemplary embodiments, it is not restricted thereto, but rather may be modified in diverse ways.

LIST OF REFERENCE SIGNS

1 Input terminal
2 Circuit for switching an AC voltage
3 AC voltage source
4 Input-side coupling capacitor
5 Diode or PIN diode
$5^2, \ldots, 5^n$ Further diode or further PIN diode
6 Output-side coupling capacitor
$6^2, \ldots, 6^n$ Further output-side coupling capacitor
7 Output terminal
$7^2, \ldots, 7^n$ Further output terminal
8 Load impedance
$8^2, \ldots, 8^n$ Further load impedance
9 DC voltage source
10 Further input terminal
11 Shunt capacitor
12 Resistor
13 Second coil
14 Series circuit
$14^2, \ldots, 14^n$ Further series circuit
15 First coil
$15^2, \ldots, 15^n$ Further first coil
16 First switch
$16^2, \ldots, 16^n$ Further first switch
18 Series circuit
19 Third coil
20 Interconnection
20' Interconnection
$21_1, 21_2, \ldots, 21_n$ Second switch
$22_1, 22_2, \ldots, 22_n$ Third switch
$23_1, 23_2, \ldots, 23_n$ Fourth switch
24 Fifth switch
25 Sixth switch
26 Seventh switch
27 Control circuit
$28_1, 28_2$ Signal line
$28^2, \ldots, 28^n$ Further signal line
29 Series circuit
30 Capacitor
$30^2, \ldots, 30^n$ Further capacitor

The invention claimed is:

1. An assembly comprising:
a first switchable AC circuit;
a second switchable AC circuit;
a first switchable DC circuit; and
a second switchable DC circuit, wherein
said first switchable AC circuit comprises an AC power source, a first diode, a first node, and a first charge storage arrangement in serial arrangement,
said second switchable AC circuit comprises said AC power source, a second diode, a second node, and a second charge storage arrangement in serial arrangement,
said first switchable DC circuit comprises a DC power source, said first diode, said first node, and a first switching element in serial arrangement,
in an closed-circuit state of said first switchable DC circuit, said first switchable DC circuit comprises a first current path between said DC power source and said first diode, said first current path comprising said first node and said first switching element,
in an open-circuit state of said first switchable DC circuit, said first switchable AC circuit comprises a second current path between said first diode and said first charge storage arrangement, said second current path comprising said first node,
said second switchable DC circuit comprises said DC power source, said second diode, said second node, and a second switching element in serial arrangement,
in an closed-circuit state of said second switchable DC circuit, said second switchable DC circuit comprises a third current path between said DC power source and said second diode, said third current path comprising said second node and said second switching element,
in an open-circuit state of said second switchable DC circuit, said second switchable AC circuit comprises a fourth current path between said second diode and said second charge storage arrangement, said fourth current path comprising said second node,
said first diode constituting, a switch of said first switchable AC circuit,
said second diode constituting a switch of said second switchable AC circuit,
in an open-circuit state of said first switchable DC circuit, all current-conducting paths that comprise said first node comprise said first diode and at least one pole of said first charge storage arrangement, and
in an open-circuit state of said second switchable DC circuit, all current-conducting paths that comprise said second node comprise said second diode and at least one pole of said second charge storage arrangement.

2. The assembly of claim 1, wherein:
in said closed-circuit state of said first switchable DC circuit, a first DC current through said first diode effects a forward bias of said first diode that closes said first switchable AC circuit.

3. The assembly of claim 1, wherein:
in said open-circuit state of said first switchable DC circuit, said AC power source effects an increase of a cathode voltage at a first cathode of said first diode relative to an anode voltage at a first anode of said first diode, which effects a reverse bias of said first diode that opens said first switchable AC circuit.

4. The assembly of claim 1, wherein:
in said closed-circuit state of said second switchable DC circuit, a second DC current through said second diode effects a forward bias of said second diode that closes said second switchable AC circuit, and
in said open-circuit state of said second switchable DC circuit, said AC power source effects an increase of a cathode voltage at a second cathode of said second diode relative to an anode voltage at a second anode of said second diode, which effects a reverse bias of said second diode that opens said second switchable AC circuit.

5. The assembly of claim 1, wherein:
in a closed-circuit state of said first switchable DC circuit, said DC power source induces a first DC current that flows through said first diode and said first switching element,
in a closed-circuit state of said second switchable DC circuit, said DC power source induces a second DC current that flows through said second diode and said second switching element,
said first switchable AC circuit is configured to inhibit a flow of said first DC current to said AC power source, and
said first switchable AC circuit is configured to inhibit a flow of said second DC current to said C power source.

6. The assembly of claim 5, wherein:
said second switchable AC circuit is configured to inhibit a flow of said first DC current to said AC power source, and
said second switchable AC circuit is configured to inhibit a flow of said second DC current to said AC power source.

7. The assembly of claim 5, wherein:
said first switchable AC circuit comprises a first spark plug,
said second switchable AC circuit comprises a second spark plug,
said first switchable AC circuit is configured to inhibit a flow of said first DC current to said first spark plug,
said first switchable AC circuit is configured to inhibit a flow of said second DC current to said first spark plug,
said second switchable AC circuit is configured to inhibit a flow of said first DC current to said second spark plug, and
said second switchable AC circuit is configured to inhibit a flow of said second DC current to said second spark plug.

8. The assembly of claim 1 wherein:
said first switchable DC circuit is configured to inhibit a flow of AC current from said AC power source to said DC power source, and
said second switchable DC circuit is configured to inhibit a flow of AC current from said AC power source to said DC power source.

9. The assembly of claim 1, comprising:
a first plurality of capacitors; and
a first plurality of switching elements, wherein
in said closed-circuit state of said first switchable DC circuit, said first plurality of switching elements are configured such that said first plurality of capacitors are connected in parallel, and
in said open-circuit state of said first switchable DC circuit, said first plurality of switching elements are configured such that said first plurality of capacitors are connected in series.

10. The assembly of claim 9, wherein:
in said open-circuit state of said first switchable DC circuit, said first plurality of capacitors connected in series contributes to a reverse bias of said first diode.

11. The assembly of claim 1, comprising:
a second plurality of capacitors; and
a second plurality of switching elements, wherein
in said closed-circuit state of said second switchable DC circuit, said second plurality of switching elements are configured such that said second plurality of capacitors are connected in parallel, and
in said open-circuit state of said second switchable DC circuit, said second plural ii of switching elements are configured such that said second plurality of capacitors are connected in series.

12. The assembly of claim 11, wherein:
in said open-circuit state of said second switchable DC circuit, said second plurality of capacitors connected in series contributes to a reverse bias of said second diode.

13. The assembly of claim 1, wherein:
said first switchable AC circuit comprises a first spark plug; and
said second switchable AC circuit comprises a second spark plug.

14. The assembly of claim 13, wherein:
said first charge storage arrangement comprises:
a first plurality of capacitors; and
a first plurality of switching elements,
in said closed-circuit state of said first switchable DC circuit, said first plurality of switching elements are configured such that said first plurality of capacitors are connected in parallel between a first cathode of said first diode and a first pole of said first spark plug, and
in said open-circuit state of said first switchable DC circuit, said first plurality of switching elements are configured such that said first plurality of capacitors are connected in series between said first cathode of said first diode and said first pole of said first spark plug.

15. The assembly of claim 14, wherein:
in said open-circuit state of said first switchable DC circuit, said first plurality of capacitors connected in series contributes to a reverse bias of said first diode.

16. The assembly of claim 1, wherein:
said first diode is a PIN diode, and
said second diode is a PIN diode.

17. The assembly of claim 1, wherein:
an output of aid AC power source has a frequency greater than 0.3 MHz.

18. The assembly of claim 1, wherein:
an output voltage between a first pole of said AC power source and a second pole of said AC power source has a peak-to-peak voltage of at least 200 V.

19. An assembly comprising:
a first switchable AC circuit;
a second switchable AC circuit;
a first switchable DC circuit;
a second switchable DC circuit;
a first plurality of switching elements; and
a second plurality of switching elements, wherein
said first switchable AC circuit comprises an AC power source, a first diode and a first charge storage arrangement in serial arrangement,
said second switchable AC circuit comprises said AC power source, a second diode and a second charge storage arrangement in serial arrangement,
said first switchable DC circuit comprises a DC power source, a shared inductive element, said first diode and a first inductive element in serial arrangement,
said second switchable DC circuit comprises said DC power source, said shared inductive element, said second diode and a second inductive element in serial arrangement,
said first diode effects a switching of said first switchable AC circuit,
said second diode effects a switching of said second switchable AC circuit,
in a first state of said first switchable DC circuit, said DC power source induces a first DC current that flows through said shared inductive element, said first diode and said first inductive element, which first DC current energizes said shared inductive element and said first inductive element, in a second state of said first switchable DC circuit, an energy stored in said shared inductive element and said first inductive element induces a flow of charge that alters a charge of said first charge storage arrangement in a manner that increases a cathode voltage at a first cathode of said first diode relative to an anode voltage at a first anode of said first diode, said first plurality of switching elements are configured such that a polarity of said first inductive element within said first switchable DC circuit is reversible, in a first state of said second switchable DC circuit, said DC power source induces a second DC current that flows through said shared inductive element, said second diode and said second inductive element, which second DC current energizes said shared inductive element and said second inductive element, in a second state of said second switchable DC circuit, an energy stored in said shared inductive element and said second inductive element induces a flow of charge that alters a charge of said second charge storage arrangement in a manner that increases a cathode voltage at a second cathode of said second diode relative to an anode voltage at a second anode of said second diode, and said second plurality of switching elements are configured such that a polarity of said second inductive element within said second switchable DC circuit is reversible.

20. A circuit for switching an alternating, voltage comprising:
- an input connection connectable to an alternating voltage source,
- an output connection connectable to a load impedance,
- a first series circuit comprising a diode and a circuit for storing electrical charge, wherein the first series circuit has a first end connection connected to the input connection and a second end connection connected to the output connection,
- a DC voltage source connected to an electrical connection between the diode and the input connection, or to an electrical connection between the diode and the output connection, and designed to generate a direct current in the diode, and
- a first switch connected to an electrical connection between the diode and the circuit for storing electrical charge and designed to switch between a switching state in which a potential dependent on a reference potential is applied to the electrical connection between the diode and the circuit for storing electrical charge, and a switching state, in which there is an electrical floating potential in the electrical connection between the diode and the circuit for storing electrical charge, wherein
- further first series circuits each comprising a further diode and a further circuit for storing electrical charge are provided, wherein each further series circuit has a first end connection and a second end connection, each first end connection being connected to the input connection and each second end connection being connected to a further output connection, each of the latter being connectable to a further load impedance and wherein, in each case, a further first switch is connected to the electrical connection between the respective further diode and the respective further circuit for storing electrical charge, and is designed to switch between a switching state in which a potential dependent on the reference potential is applied at the electrical connection between the respective further diode and the respective further circuit for storing electrical charge, and a switching state in which an electrical floating potential is applied in the electrical connection between the respective further diode and the respective further circuit for storing electrical charge, in order thus to switch each individual further diode separately in the forward or reverse direction.

* * * * *